(12) United States Patent
Miyamoto et al.

(10) Patent No.: US 12,038,567 B2
(45) Date of Patent: Jul. 16, 2024

(54) PULSE WIDTH EXPANSION APPARATUS AND ELECTRONIC DEVICE MANUFACTURING METHOD

(71) Applicant: Gigaphoton Inc., Tochigi (JP)

(72) Inventors: Hirotaka Miyamoto, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 224 days.

(21) Appl. No.: 17/858,765

(22) Filed: Jul. 6, 2022

(65) Prior Publication Data

US 2022/0350120 A1 Nov. 3, 2022

Related U.S. Application Data

(63) Continuation of application No. PCT/JP2020/008159, filed on Feb. 27, 2020.

(51) Int. Cl.
*G03F 7/20* (2006.01)
*G02B 5/30* (2006.01)
(Continued)

(52) U.S. Cl.
CPC ......... *G02B 17/023* (2013.01); *G02B 5/3083* (2013.01); *G02B 26/0816* (2013.01);
(Continued)

(58) Field of Classification Search
CPC ................ G02B 17/023; G02B 5/3083; G02B 26/0816; G02B 27/283; G02B 2207/117;
(Continued)

(56) References Cited

U.S. PATENT DOCUMENTS

| 5,260,954 A | 11/1993 | Dane et al. |
| 6,067,311 A | 5/2000 | Morton et al. |

(Continued)

FOREIGN PATENT DOCUMENTS

| JP | 2006-186046 A | 7/2006 |
| JP | 2008-505495 A | 2/2008 |

(Continued)

OTHER PUBLICATIONS

International Search Report issued in PCT/JP2020/008159; mailed Jun. 2, 2020.

(Continued)

*Primary Examiner* — Mesfin T Asfaw
(74) *Attorney, Agent, or Firm* — Studebaker & Brackett PC

(57) ABSTRACT

A pulse width expansion apparatus according to an aspect of the present disclosure includes a polarization beam splitter and a transfer optical system. The transfer optical system includes ¼-wavelength and reflection mirror pairs. The ¼-wavelength mirror pair include first and second ¼-wavelength mirrors. The first ¼-wavelength mirror provides ¼-wavelength phase shift and reflects a pulse laser beam. The second ¼-wavelength mirror provides ¼-wavelength phase shift and reflects the pulse laser beam reflected by the first ¼-wavelength mirror. The reflection mirror pair are disposed on an optical path before and after or between the ¼-wavelength mirror pair. The transfer optical system transfers an image of an input pulse laser beam on the polarization beam splitter to the optical path between the ¼-wavelength mirror pair at one-to-one magnification as a first transfer image and transfers the first transfer image to the polarization beam splitter at one-to-one magnification as a second transfer image.

20 Claims, 16 Drawing Sheets

(51) Int. Cl.
  *G02B 17/02*   (2006.01)
  *G02B 26/08*   (2006.01)
  *G02B 27/28*   (2006.01)
  *G03F 7/00*    (2006.01)
  *H01S 3/00*    (2006.01)
  *H01S 3/08*    (2023.01)
  *H01S 3/225*   (2006.01)
  *H01S 3/23*    (2006.01)

(52) U.S. Cl.
  CPC ....... *G02B 27/283* (2013.01); *G03F 7/70025* (2013.01); *G03F 7/70041* (2013.01); *G03F 7/70308* (2013.01); *G03F 7/70316* (2013.01); *H01S 3/0057* (2013.01); *H01S 3/08009* (2013.01); *H01S 3/225* (2013.01); *H01S 3/2366* (2013.01); *G02B 2207/117* (2013.01)

(58) Field of Classification Search
  CPC .... G02B 5/0891; G02B 27/286; G02B 27/48; G03F 7/70025; G03F 7/70041; G03F 7/70308; G03F 7/70316; G03F 7/70583; G03F 7/20; G03F 7/70575; H01S 3/0057; H01S 3/08009; H01S 3/225; H01S 3/2366; H01S 3/005; H01S 3/0071; H01S 3/08004; H01S 3/10092

See application file for complete search history.

(56) References Cited

U.S. PATENT DOCUMENTS

| | | |
|---|---|---|
| 2012/0147457 A1 | 6/2012 | Fujimoto et al. |
| 2015/0372446 A1* | 12/2015 | Chuang .................. H01S 3/083 372/25 |
| 2019/0103724 A1 | 4/2019 | Onose et al. |

FOREIGN PATENT DOCUMENTS

| | | |
|---|---|---|
| JP | 2008-071866 A | 3/2008 |
| JP | 2011-054737 A | 3/2011 |
| WO | 2006/012062 A2 | 2/2006 |
| WO | 2018/020564 A1 | 2/2018 |

OTHER PUBLICATIONS

International Preliminary Report On Patentability and Written Opinion issued in PCT/JP2020/008159; issued Aug. 30, 2022.

* cited by examiner 830.245                               1638.780
Count: 307200          Min: 830.245
Mean: 1182.384         Max: 1638.780
StdDev: 95.670         Mode: 1182.400(4108)
Bins: 256              Bin Width: 3.158

S-POLARIZED LIGHT →
P-POLARIZED LIGHT ⇢

S-POLARIZED LIGHT →
P-POLARIZED LIGHT ⇢

INCIDENCE-EMISSION
OPTICAL AXIS

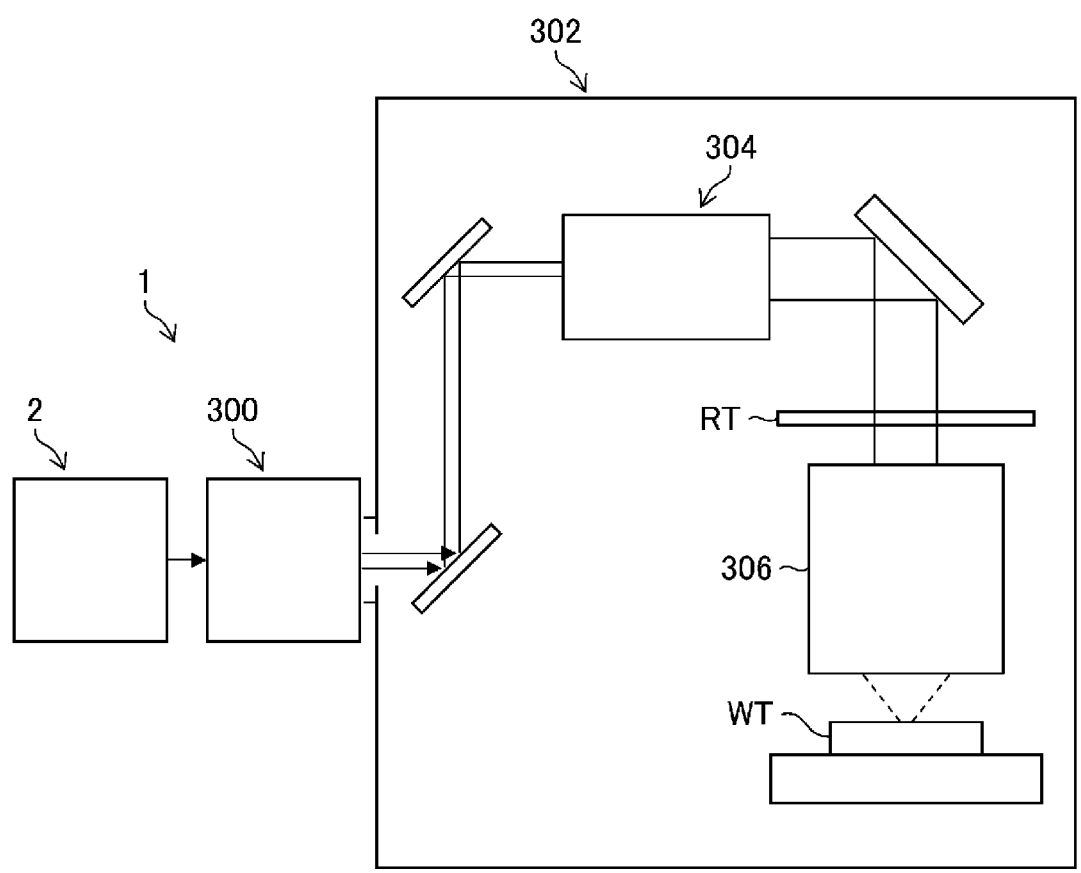

PULSE WIDTH EXPANSION APPARATUS AND ELECTRONIC DEVICE MANUFACTURING METHOD

CROSS-REFERENCE TO RELATED APPLICATIONS

The present application is a continuation application of International Application No. PCT/JP2020/008159, filed on Feb. 27, 2020, the entire contents of which are hereby incorporated by reference.

BACKGROUND

1. Technical Field

The present disclosure relates to a pulse width expansion apparatus and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to emit a laser beam having a wavelength of 248 nm approximately and an ArF excimer laser apparatus configured to emit a laser beam having a wavelength of 193 nm approximately.

The KrF excimer laser apparatus and the ArF excimer laser apparatus have a wide spectrum line width of 350 to 400 pm for spontaneous oscillation light. Thus, chromatic aberration occurs in some cases when a projection lens is made of a material that transmits ultraviolet light such as a KrF or ArF laser beam. As a result, resolving power potentially decreases. Thus, the spectrum line width of a laser beam emitted from such a gas laser apparatus needs to be narrowed until chromatic aberration becomes negligible. To narrow the spectrum line width, a line narrowing module (LNM) including a line narrowing element (for example, etalon or grating) is provided in a laser resonator of the gas laser apparatus in some cases. In the following description, a gas laser apparatus that achieves narrowing of the spectrum line width is referred to as a line narrowing gas laser apparatus.

LIST OF DOCUMENTS

Patent Documents

Patent Document 1: U.S. Pat. No. 6,067,311
Patent Document 2: Japanese Unexamined Patent Application Publication No. 2006-186046

SUMMARY

A pulse width expansion apparatus according to an aspect of the present disclosure includes a polarization beam splitter and a transfer optical system. The polarization beam splitter transmits a pulse laser beam having a first polarization direction in a linearly polarized pulse laser beam at a first transmittance, and reflects a pulse laser beam having a second polarization direction orthogonal to the first polarization direction at a first reflectance while transmitting the pulse laser beam having the second polarization direction at a second transmittance. In the transfer optical system, the pulse laser beam reflected by the polarization beam splitter is reflected by a plurality of concave mirrors and returned to the polarization beam splitter. The polarization beam splitter synthesizes and outputs a pulse laser beam having the second polarization direction and transmitted at the second transmittance in an input pulse laser beam from outside, and part of the pulse laser beam returned from the transfer optical system. The transfer optical system includes a ¼-wavelength mirror pair and a reflection mirror pair. The ¼-wavelength mirror pair include a first ¼-wavelength mirror and a second ¼-wavelength mirror. The first ¼-wavelength mirror shifts a phase of a pulse laser beam by ¼ of a wavelength of the pulse laser beam and reflect the pulse laser beam. The second ¼-wavelength mirror shifts the phase of the pulse laser beam reflected by the first ¼-wavelength mirror by ¼ of the wavelength of the pulse laser beam and reflect the pulse laser beam. The reflection mirror pair are disposed on an optical path before and after the ¼-wavelength mirror pair or on an optical path between the ¼-wavelength mirror pair. The transfer optical system transfers an image of the input pulse laser beam on the polarization beam splitter to the optical path between the ¼-wavelength mirror pair at one-to-one magnification as a first transfer image and transfers the first transfer image to the polarization beam splitter at one-to-one magnification as a second transfer image.

An electronic device manufacturing method according to another aspect of the present disclosure includes generating a pulse laser beam subjected to pulse width expansion through a laser system, emitting the pulse laser beam to an exposure apparatus, and exposing a photosensitive substrate to the pulse laser beam in the exposure apparatus to manufacture an electronic device. The laser system includes a laser apparatus and a pulse width expansion apparatus. The pulse width expansion apparatus includes a polarization beam splitter and a transfer optical system. The laser apparatus generates a linearly polarized pulse laser beam. The polarization beam splitter transmits a pulse laser beam having a first polarization direction in a linearly polarized pulse laser beam at a first transmittance, and reflects a pulse laser beam having a second polarization direction orthogonal to the first polarization direction at a first reflectance while transmitting the pulse laser beam having the second polarization direction at a second transmittance. In the transfer optical system, the pulse laser beam reflected by the polarization beam splitter is reflected by a plurality of concave mirrors and returned to the polarization beam splitter. The polarization beam splitter synthesizes and outputs a pulse laser beam having the second polarization direction and transmitted at the second transmittance in an input pulse laser beam from outside, and part of the pulse laser beam returned from the transfer optical system. The transfer optical system includes a ¼-wavelength mirror pair and a reflection mirror pair. The ¼-wavelength mirror pair include a first ¼-wavelength mirror and a second ¼-wavelength mirror. The first ¼-wavelength mirror shifts a phase of a pulse laser beam by ¼ of a wavelength of the pulse laser beam and reflects the pulse laser beam. The second ¼-wavelength mirror shifts the phase of the pulse laser beam reflected by the first ¼-wavelength mirror by ¼ of the wavelength of the pulse laser beam and reflect the pulse laser beam. The reflection mirror pair are disposed on an optical path before and after the ¼-wavelength mirror pair or on an optical path between the ¼-wavelength mirror pair. The transfer optical system transfers an image of the input pulse laser beam on the polarization beam splitter to the optical path between the ¼-wavelength mirror pair at one-to-one magnification as a first transfer image and transfers the first transfer image to the polarization beam splitter at one-to-one magnification as a second transfer image.

A pulse width expansion apparatus according to another aspect of the present disclosure includes a polarization beam splitter and a transfer optical system. The polarization beam splitter transmits a pulse laser beam having a first polarization direction in a linearly polarized pulse laser beam at a first transmittance, and reflects a pulse laser beam having a second polarization direction orthogonal to the first polarization direction at a first reflectance while transmitting the pulse laser beam having the second polarization direction at a second transmittance. In the transfer optical system, the pulse laser beam reflected by the polarization beam splitter is reflected by a plurality of concave mirrors and returned to the polarization beam splitter. The polarization beam splitter synthesizes and outputs a pulse laser beam having the second polarization direction and transmitted at the second transmittance in an input pulse laser beam from outside, and part of the pulse laser beam returned from the transfer optical system. The transfer optical system includes a first transfer optical system and a second transfer optical system. The first transfer optical system includes a first ¼-wavelength mirror and a first reflection mirror. The first ¼-wavelength mirror shifts a phase of a pulse laser beam by ¼ of a wavelength of the pulse laser beam and reflect the pulse laser beam. The first reflection mirror reflects the pulse laser beam reflected by the first ¼-wavelength mirror toward the first ¼-wavelength mirror. The second transfer optical system includes a second ¼-wavelength mirror and a second reflection mirror. The second ¼-wavelength mirror shifts the phase of the pulse laser beam by ¼ of the wavelength of the pulse laser beam and reflect the pulse laser beam. The second reflection mirror reflects the pulse laser beam reflected by the second ¼-wavelength mirror toward the second ¼-wavelength mirror. The first transfer optical system transfers an image of the input pulse laser beam on the polarization beam splitter to the first reflection mirror at one-to-one magnification as a first transfer image and transfers the first transfer image to the polarization beam splitter at one-to-one magnification as a second transfer image. The second transfer optical system transfers the second transfer image to the second reflection mirror at one-to-one magnification as a third transfer image and transfers the third transfer image to the polarization beam splitter at one-to-one magnification as a fourth transfer image.

BRIEF DESCRIPTION OF THE DRAWINGS

Embodiments of the present disclosure will be described below as examples with reference to the accompanying drawings.

FIG. 24 is a diagram schematically illustrating an exemplary configuration of an exposure apparatus.

DESCRIPTION OF EMBODIMENTS

Contents

1. Terms 1.1 Definition of E95
1.2 Definition of Coherent Length
1.3 Definition of Speckle Contrast 2. Overview of Laser System 2.1 Configuration
2.2 Operation
2.3 Effect 3. Problem 4. Embodiment 1

4.1 Configuration
4.1.1 Disposition of ¼-Wavelength Mirror and High Reflective Mirror
4.2 Operation
4.3 Effect 5. Embodiment 2

5.1 Configuration
5.1.1 Disposition of ¼-Wavelength Mirror and High Reflective Mirror
5.2 Operation
5.3 Effect 6. Modification 1 of Embodiment 2

6.1 Configuration
6.2 Operation
6.3 Effect

7. Modification 2 of Embodiment 2

7.1 Configuration
7.2 Operation
7.3 Effect

8. Modification 3 of Embodiment 2

8.1 Configuration
8.2 Operation
8.3 Effect

9. Embodiment 3

9.1 Configuration
9.2 Operation
9.3 Effect

10. Electronic Device Manufacturing Method

11. Other

Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

Figure 1:
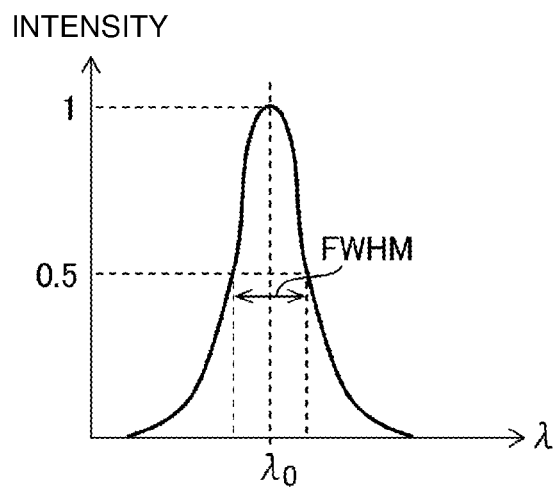
FIG. 1 is a diagram for description of a spectrum line width.

Terms used in the present specification are defined as follows.
1.1 Definition of E95
A spectrum line width is the full width of the spectrum waveform of a laser beam as illustrated in FIG. 1 at a light amount threshold value. In the present specification, the relative value of each light amount threshold value relative to a light amount peak value is referred to as a line width threshold value Thresh (0<Thresh<1). For example, the half value of the peak value is referred to as a line width threshold value 0.5. Note that the full width W/2 of the spectrum waveform at the line width threshold value 0.5 is specially referred to as full width at half maximum (FWHM).

Figure 2:
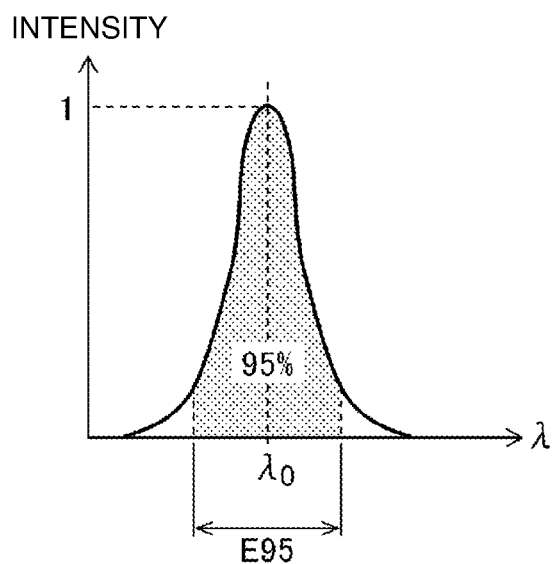
FIG. 2 is a diagram for description of definition of E95.

Spectral purity, for example, 95% purity E95 is full width W95% of a part occupying 95% of the entire spectrum energy and centered at a wavelength $\lambda_0$ as illustrated in FIG. 2, and Expression (1) below holds.

[Math. 1]

$$\frac{\int_{-\frac{\Delta\lambda}{2}}^{\frac{\Delta\lambda}{2}} g(\lambda + \lambda_0) d\lambda}{\int_{-\infty}^{\infty} g(\lambda + \lambda_0) d\lambda} = 0.95 \quad (1)$$

Note that spectral purity in the present specification is E95 unless otherwise stated.
1.2 Definition of Coherent Length
When $\lambda_0$ represents the central wavelength of a laser beam and $\Delta\lambda$ represents the spectrum line width, the coherent length of the laser beam can be expressed by Expression (2) below.

[Math. 2]

$$\text{Coherent length} = \frac{\lambda_0^2}{\Delta\lambda} \quad (2)$$

Figure 3:
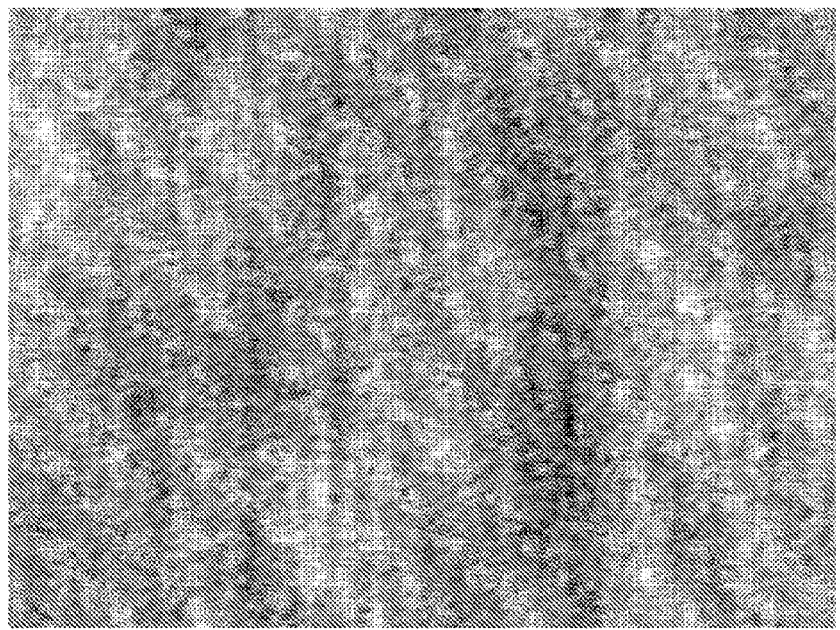
FIG. 3 is a diagram illustrating an exemplary speckle image obtained by capturing a pattern made of grayscale spots.
Figure 4:
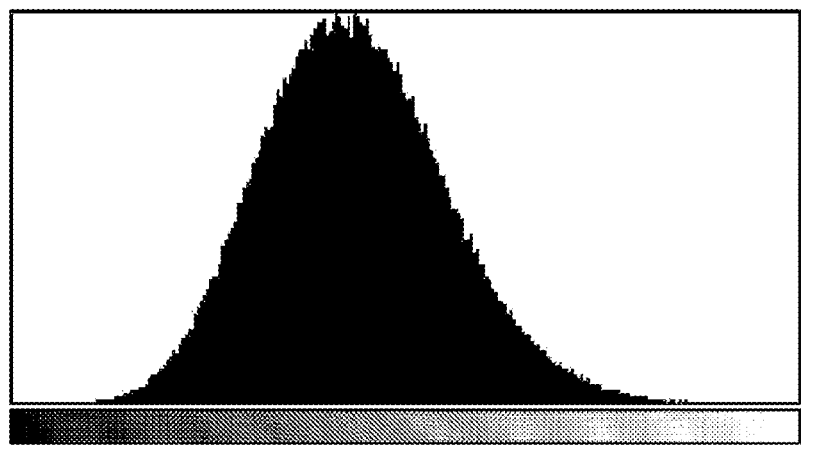
FIG. 4 is a diagram illustrating a grayscale histogram of the speckle image illustrated in FIG. 3.

1.3 Definition of Speckle Contrast
A speckle is a grayscale spot generated when a laser beam is scattered at a random medium. FIG. 3 is a diagram illustrating an exemplary speckle image obtained by capturing a pattern made of grayscale spots. FIG. 4 is a diagram illustrating a grayscale histogram of the speckle image illustrated in FIG. 3.

A speckle contrast SC is typically used as a speckle evaluation indicator. When $\sigma$ represents the standard deviation of the intensity of a speckle image and I macron (I with a macron thereon) represents the average of the intensity of the speckle image, the speckle contrast SC can be expressed by Expression (3) below.

[Math. 3]

$$SC = \frac{\sigma}{\bar{I}} \quad (3)$$

The term "parallel" in the present specification may include the concept of "substantially parallel", which can be regarded as an equivalent to "parallel" in effect in technological meaning. The term "vertical" or "orthogonal" in the present specification may include the concept of "substantially vertical" or "substantially orthogonal", which can be regarded as an equivalent to "vertical" in effect or "orthogonal" in effect in technological meaning. The term "45°" in the present specification may include a concept that can be regarded substantially as an equivalent to "45°" in effect in technological meaning.

Figure 5:
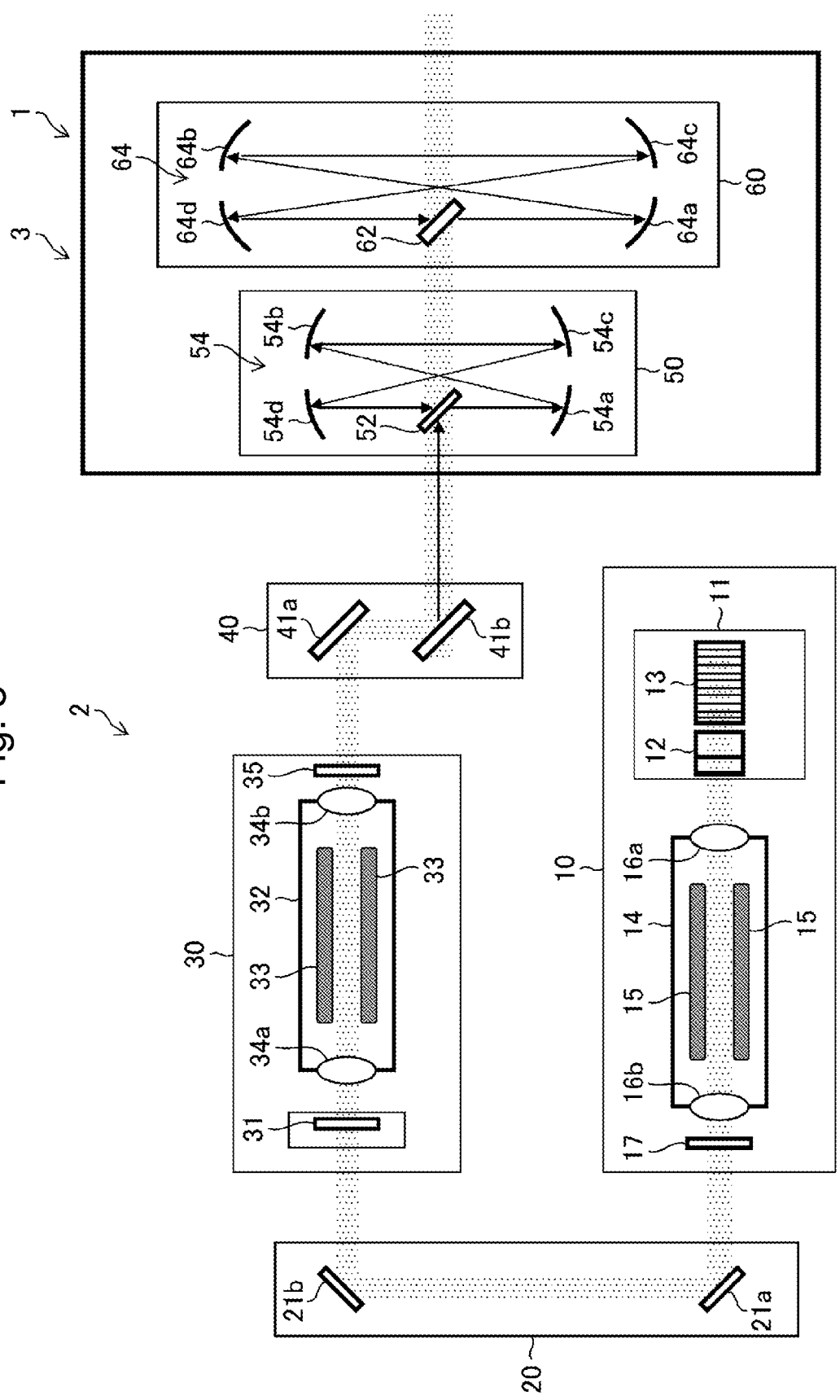
FIG. 5 is a diagram illustrating the configuration of a laser system.

2. Overview of Laser System 2.1 Configuration
FIG. 5 is a diagram illustrating the configuration of a laser system 1. As illustrated in FIG. 5, the laser system 1 includes an excimer laser apparatus 2 and a pulse width expansion apparatus 3.

The excimer laser apparatus 2 is an apparatus configured to generate a pulse laser beam by using an optical resonator. The excimer laser apparatus 2 includes a master oscillator (MO) 10, an MO beam steering unit 20, a power oscillator (PO) 30, and a PO beam steering unit 40.

The MO 10 includes a line narrowing module (LNM) 11, a chamber 14, and an output coupler (OC) 17.

The LNM 11 includes a prism beam expander 12 for narrowing the spectrum line width and a grating 13. The prism beam expander 12 and the grating 13 are Littrow-disposed to have an incident angle and a diffracting angle equal to each other.

The OC 17 is a reflection mirror having a reflectance of 40% to 60%. The OC 17 and the LNM 11 are disposed to constitute the optical resonator.

The chamber 14 is disposed on the optical path of an optical resonator. The chamber 14 includes a pair of discharge electrodes 15, and two windows 16a and 16b through which a pulse laser beam transmits. The chamber 14 houses excimer laser gas inside. The excimer laser gas may include, for example, Ar gas or Kr gas as rare gas, $F_2$ gas as halogen gas, and Ne gas as buffer gas.

The MO beam steering unit 20 includes a high reflective mirror 21a and a high reflective mirror 21b. The high reflective mirror 21a and the high reflective mirror 21b are disposed so that a pulse laser beam emitted from the MO 10 is incident on the PO 30.

The PO 30 includes a rear mirror 31, a chamber 32, and an OC 35. The rear mirror 31 and the OC 35 are disposed to constitute an optical resonator.

The chamber 32 is disposed on the optical path of the optical resonator. The chamber 32 includes a pair of discharge electrodes 33, and two window 34a and 34b through which a pulse laser beam transmits. The chamber 32 houses excimer laser gas inside. The chamber 32 has a configuration same as that of the chamber 14.

The rear mirror 31 is a reflection mirror having a reflectance of 50% to 90%. The OC 35 is a reflection mirror having a reflectance of 10% to 30%.

The PO beam steering unit 40 includes a high reflective mirror 41a and a high reflective mirror 41b. The high reflective mirror 41a and the high reflective mirror 41b are disposed so that a pulse laser beam output from the PO 30 is incident on the pulse width expansion apparatus 3.

The pulse width expansion apparatus 3 is an apparatus configured to expand the pulse width of a pulse laser beam emitted from the excimer laser apparatus 2. The pulse width expansion apparatus 3 includes an optical pulse stretcher (OPS) 50 and an OPS 60.

The OPS 50 includes a beam splitter 52 and four concave mirrors 54.

The beam splitter 52 is disposed on the optical path of a pulse laser beam output from the PO beam steering unit 40. The beam splitter 52 is a reflection mirror configured to transmit part of an incident pulse laser beam and reflect the other part. The reflectance of the beam splitter 52 is preferably 40% to 70%, more preferably 60% approximately. The beam splitter 52 is disposed so that a pulse laser beam transmitted through the beam splitter 52 is incident on the OPS 60.

The four concave mirrors 54 constitute a delay optical path of a pulse laser beam reflected by a first surface of the beam splitter 52. The four concave mirrors 54 are a concave mirror 54a, a concave mirror 54b, a concave mirror 54c, and a concave mirror 54d, each having a focal length $F_1$.

The concave mirror 54a and the concave mirror 54b are disposed so that the pulse laser beam reflected by the first surface of the beam splitter 52 is reflected by the concave mirror 54a and incident the concave mirror 54b. The concave mirror 54c and the concave mirror 54d are disposed so that the pulse laser beam reflected by the concave mirror 54b is reflected by the concave mirror 54c and incident on the concave mirror 54d. The concave mirror 54d is disposed so that the pulse laser beam reflected by the concave mirror 54d is incident on a second surface opposite to the first surface of the beam splitter 52.

The concave mirror 54a and the concave mirror 54b are disposed so that the pulse laser beam reflected by the first surface of the beam splitter 52 forms an image on the first surface of the beam splitter 52 as a first image at one-to-one magnification (1:1). The concave mirror 54c and the concave mirror 54d are disposed so that the first image is formed as a second image on the second surface of the beam splitter 52 at 1:1.

The delay optical path constituted by the four concave mirrors 54 is configured to have a one-round delay optical path length $L_{OPS1}$ equal to or longer than a coherent length Lc of a pulse laser beam, in other words, to satisfy $L_{OPS1} \geq Lc$. The coherent length Lc of a pulse laser beam can be calculated by using Expression (2) described above. For example, the coherent length Lc of a pulse laser beam having a spectrum line width $\Delta\lambda$ of 0.3 pm and a central wavelength $\lambda_0$ of 193.35 nm is 0.125 m. For example, the one-round delay optical path length $L_{OPS1}$ of the OPS 50 is 7 m.

The OPS 60 is disposed on the optical path of a pulse laser beam output from the OPS 50. The OPS 60 includes a beam splitter 62 and four concave mirrors 64. The four concave mirrors 64 are a concave mirror 64a, a concave mirror 64b, a concave mirror 64c, and a concave mirror 64d, each having a focal length $F_2$ longer than $F_1$.

The beam splitter 62 and the four concave mirrors 64 of the OPS 60 are disposed in a manner same as that of the beam splitter 52 and the four concave mirrors 54 of the OPS 50. For example, the OPS 60 has a one-round delay optical path length $L_{OPS2}$ of 14 m.

2.2 Operation

Operation of the laser system 1 will be described below. When discharge occurs in the chamber 14, laser gas is excited and a pulse laser beam subjected to line narrowing through the optical resonator constituted by the OC 17 and the LNM 11 is output from the OC 17. The pulse laser beam is incident as seed light on the rear mirror 31 of the PO 30 through the MO beam steering unit 20.

Discharge occurs in the chamber 32 in synchronization with a timing at which the seed light transmitted through the rear mirror 31 is incident. As a result, laser gas is excited, the seed light is amplified by the Fabry-Perot optical resonator constituted by the OC 35 and the rear mirror 31, and the amplified pulse laser beam is output from the OC 35. The pulse laser beam output from the OC 35 is incident on the pulse width expansion apparatus 3 through the PO beam steering unit 40.

The pulse laser beam incident on the pulse width expansion apparatus 3 is then incident on the first surface of the beam splitter 52 of the OPS 50. Part of the pulse laser beam incident on the first surface of the beam splitter 52 is transmitted through the beam splitter 52 and output from the OPS 50 as a first pulse laser beam of zero-round light not having completed a round through the delay optical path.

The pulse laser beam incident on the first surface of the beam splitter 52 and reflected by the first surface of the beam splitter 52 enters the delay optical path and is reflected by the concave mirror 54a and the concave mirror 54b. The optical image of the pulse laser beam reflected by the first surface of the beam splitter 52 is formed as a first transfer image at 1:1 by the concave mirror 54a and the concave mirror 54b.

Then, the first transfer image is formed as a second transfer image on the second surface of the beam splitter 52 at 1:1 by the concave mirror 54c and the concave mirror 54d.

Part of the pulse laser beam incident on the second surface of the beam splitter 52 from the concave mirror 54d is reflected by the second surface of the beam splitter 52 and output from the OPS 50 as a second pulse laser beam of one-round light having completed a round through the delay optical path. The second pulse laser beam is output behind the first pulse laser beam by a delay time $\Delta t_1$. The delay time $\Delta t_1$ can be expressed as $L_{OPS1}/c$, where c represents the speed of light.

The pulse laser beam incident as the second transfer image on the second surface of the beam splitter 52 and transmitted through the beam splitter 52 then enters the delay optical path and is reflected by the four concave mirrors 54 and incident on the second surface of the beam splitter 52 again. Then, the pulse laser beam reflected by the second surface of the beam splitter 52 is output from the OPS 50 as a third pulse laser beam of two-round light having completed two rounds through the delay optical path. The third pulse laser beam is output behind the second pulse laser beam by the delay time $\Delta t_1$.

Thereafter, fourth to n-th pulse laser beams are output from the OPS 50 as light repeats rounds through the delay optical path. The light intensity of the pulse light output from the OPS 50 decreases as the number of rounds through the delay optical path increases.

The second to n-th pulse laser beams are each synthesized and output behind the first pulse laser beam by an integral multiple of the delay time $\Delta t_1$, and accordingly, the pulse waveforms thereof are superimposed. As a result, the pulse width is expanded (stretched). The first to n-th pulse laser beams are superimposed through an optical path equal to or longer than the coherent length, and accordingly, the coherence of the laser beams decreases.

Similarly, the pulse width of the pulse laser beam output from the OPS 50 is expanded by the OPS 60, and the coherence further decreases.

The pulse laser beam having passed through the OPS 50 and the OPS 60 is emitted from the laser system 1. In this case, the pulse laser beam may be emitted from the laser system 1 through a non-illustrated monitor module configured to measure the pulse energy, the spectrum line width, the wavelength, and the like thereof.

2.3 Effect

In the laser system 1, the pulse width of a pulse laser beam emitted from the excimer laser apparatus 2 is expanded by the pulse width expansion apparatus 3, and thus the temporal energy density of a pulse laser beam emitted from the laser system 1 can be reduced. Accordingly, damage on an optical element following the laser system 1 can be reduced. Moreover, the pulse width expansion further generates an effect of decreasing the coherence of the pulse laser beam.

3. Problem

With the progress of high-resolution exposure in electronic device manufacturing, it has been required to further decrease the coherence of a laser beam emitted from an exposure laser system. For this requirement, it is needed to extend the delay optical path length of an OPS twice or more. However, it has been difficult to incorporate the OPS, the delay optical path of which is extended twice or more, into an existing laser system due to spatial constraints.

4. Embodiment 1

A double path OPS 70 according to Embodiment 1 will be described below. The double path OPS 70 is applied in place of the OPS 60 of the pulse width expansion apparatus 3 illustrated in FIG. 5. Hereinafter, a part common to that of the OPS 60 is denoted by the same reference sign, and detailed description thereof is omitted. Note that the double path OPS 70 may be applied in place of the OPS 50 of the pulse width expansion apparatus 3 illustrated in FIG. 5 or may be applied in place of each of the OPS 50 and the OPS 60. The double path OPS 70 may be incorporated inside the excimer laser apparatus 2.

4.1 Configuration

Figure 6:
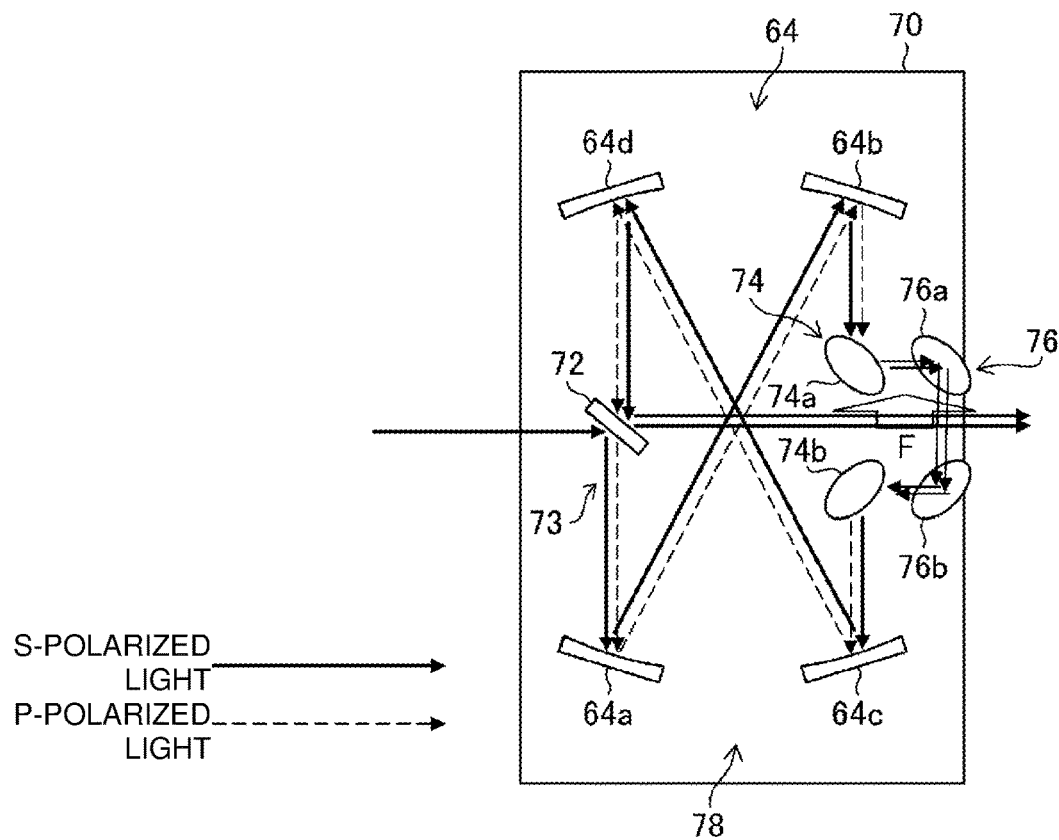
FIG. 6 is a diagram illustrating the configuration of a double path OPS according to Embodiment 1.

FIG. 6 is a diagram illustrating the configuration of the double path OPS 70 according to Embodiment 1. As illustrated in FIG. 6, the double path OPS 70 includes a polarization beam splitter 72, a transfer optical system 73, and an optical plate 78.

The polarization beam splitter 72 reflects a pulse laser beam having S-polarization (an example of a second polarization direction) in an input pulse laser beam that is a linearly polarized pulse laser beam incident from outside the double path OPS 70 at 60% (an example of a first reflectance) and transmits the pulse laser beam at 40% (an example of a second transmittance). The polarization beam splitter 72 transmits a pulse laser beam having P-polarization (an example of a first polarization direction) in an incident linearly polarized pulse laser beam at substantially 100% (an example of a first transmittance). A first surface of the polarization beam splitter 72 is disposed at a tilt of 45° relative to the optical axis of an input pulse laser beam.

The transfer optical system 73 includes the four concave mirrors 64 (an example of a plurality of concave mirrors), a ¼-wavelength mirror pair 74, and a high reflective mirror pair 76. In the transfer optical system 73, a pulse laser beam reflected by the polarization beam splitter 72 is reflected by the four concave mirrors 64 and returned to the polarization beam splitter 72.

The ¼-wavelength mirror pair 74 and the high reflective mirror pair 76 function as a retarder configured to rotate the polarization direction of a linearly polarized pulse laser beam by 90°.

The ¼-wavelength mirror pair 74 are constituted by a ¼-wavelength mirror 74a and a ¼-wavelength mirror 74b. The ¼-wavelength mirror 74a and the ¼-wavelength mirror 74b are each an optical element configured to shift the phase of an incident pulse laser beam by ¼ of the wavelength thereof and reflect the pulse laser beam.

The high reflective mirror pair 76 are constituted by a high reflective mirror 76a (an example of a first reflection mirror) and a high reflective mirror 76b (an example of a second reflection mirror). The high reflective mirror 76a and the high reflective mirror 76b are, for example, optical elements having a reflectance of 99% or higher.

The high reflective mirror 76a and the high reflective mirror 76b are each formed by coating the surface of a basal plate with a high reflective film. The material of the basal plate contains at least one of $CaF_2$ and $SiO_2$. The material of the high reflective film contains at least one of $AlF_3$, $GdF_3$, $BaF_2$, $SrF_2$, $NaF_2$, $MgF_2$, $LaF_3$, a composite of $GdF_3$ and $NdF_3$, $Al_2O_3$, $SiO_2$, F-doped $SiO_2$, $TiO_2$, and $SrF_2$. The film thickness of the high reflective film is $\lambda_0/2n$, where n is an integer equal to or larger than one.

Figure 7:
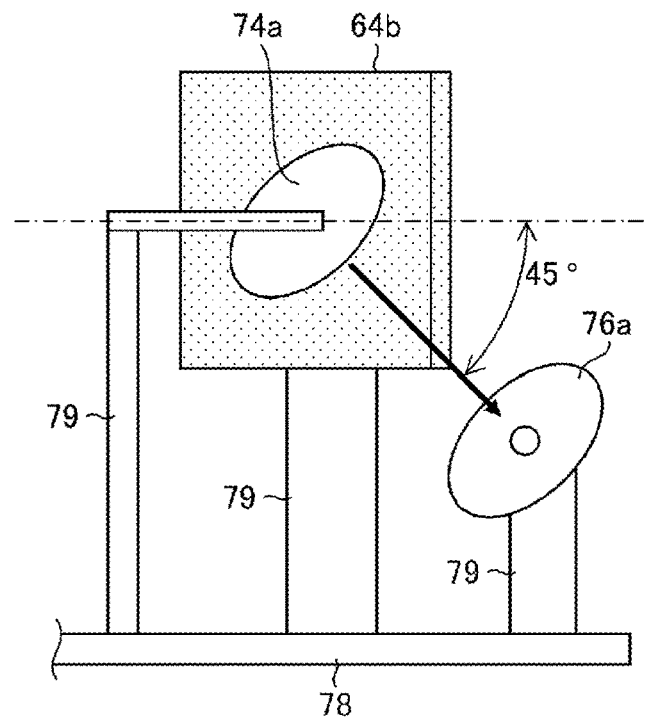
FIG. 7 is a diagram viewed in the direction of arrow F in FIG. 6.

The optical plate 78 supports each of the polarization beam splitter 72, the four concave mirrors 64, the ¼-wavelength mirror pair 74, and the high reflective mirror pair 76 through a holder 79 (refer to FIG. 7). The positions and postures of the polarization beam splitter 72, the four concave mirrors 64, the ¼-wavelength mirror pair 74, and the high reflective mirror pair 76 are adjusted for the optical path of a pulse laser beam.

The concave mirror 64a and the concave mirror 64b are disposed so that a pulse laser beam reflected by the polarization beam splitter 72 is reflected by the concave mirror 64a and incident on the concave mirror 64b. The concave mirror 64b is disposed so that the pulse laser beam reflected by the concave mirror 64b is incident on the ¼-wavelength mirror 74a.

The ¼-wavelength mirror pair 74 are disposed on the optical path between the concave mirror 64b and the concave mirror 64c. The high reflective mirror pair 76 are disposed on the optical path between the ¼-wavelength mirror pair 74. The high reflective mirror pair 76 may be disposed on the optical path before and after the ¼-wavelength mirror pair 74.

The ¼-wavelength mirror 74a and the high reflective mirror 76a are disposed so that the pulse laser beam reflected by the concave mirror 64b is reflected by the ¼-wavelength mirror 74a and incident on the high reflective mirror 76a.

The high reflective mirror 76b and the ¼-wavelength mirror 74b are disposed so that the pulse laser beam reflected by the high reflective mirror 76a is reflected by the high reflective mirror 76b and incident on the ¼-wavelength mirror 74b.

The concave mirror 64c and the concave mirror 64d are disposed so that the pulse laser beam reflected by the ¼-wavelength mirror 74b is reflected by the concave mirror 64c and incident on the concave mirror 64d. The concave mirror 64d is further disposed so that the pulse laser beam reflected by the concave mirror 64d is incident on the polarization beam splitter 72.

The distance between the polarization beam splitter 72 and the concave mirror 64a and the distance between the concave mirror 64d and the polarization beam splitter 72 are equal to the focal length $F_2$. The distance between the concave mirror 64a and the concave mirror 64b and the distance between the concave mirror 64c and the concave mirror 64d are each two times longer than the focal length $F_2$. The distance between the concave mirror 64b and the concave mirror 64c on the optical path is two times longer than the focal length $F_2$.

The concave mirror 64a, the concave mirror 64b, the ¼-wavelength mirror 74a, and the high reflective mirror 76a are configured so that an image on the first surface of the polarization beam splitter 72 is transferred to an intermediate position between the high reflective mirror 76a and the high reflective mirror 76b at 1:1 as a first image.

The high reflective mirror 76b, the ¼-wavelength mirror 74b, the concave mirror 64c, and the concave mirror 64d are configured so that the first image is transferred to the first surface of the polarization beam splitter 72 at 1:1 as a second image. In an actual double path OPS, the optical path length between first and second surfaces of a polarization beam splitter at the position of incidence on the OPS is sufficiently short relative to an optical path length equivalent to one round through the OPS optical path. Thus, sufficient functions are obtained whether the transfer position of the second image is set to the second surface or the OPS.

The following description will be made on an example in which the transfer position of the second image is at the second surface.

4.1.1 Disposition of ¼-Wavelength Mirror and High Reflective Mirror

The optical path from the ¼-wavelength mirror 74a to the high reflective mirror 76a is set to have an angle of 45° relative to the optical path up to the ¼-wavelength mirror 74a. This direction has an angle of 45° relative to both a polarization direction orthogonal to the sheet of FIG. 6 and a polarization direction along the sheet.

FIG. 7 is a diagram viewed in the direction of arrow F in FIG. 6. As illustrated in FIG. 7, the high reflective mirror 76a is disposed on the optical plate 78 side of the ¼-wavelength mirror 74a at an angle of 45° relative to both the direction orthogonal to the sheet of FIG. 6 and the direction along the sheet. The ¼-wavelength mirror 74a bends the optical path of a pulse laser beam toward the optical plate 78 side at an angle of 45° and directs the pulse laser beam to the high reflective mirror 76a.

Similarly, the high reflective mirror 76b is disposed on the optical plate 78 side of the ¼-wavelength mirror 74b at an angle of 45° relative to both the direction orthogonal to the sheet of FIG. 6 and the direction along the sheet. The high reflective mirror 76b bends the optical path of a pulse laser beam toward a side opposite to the optical plate 78 at an angle of 45° and directs the pulse laser beam to the ¼-wavelength mirror 74b.

The optical path between the high reflective mirror 76a and the high reflective mirror 76b is set to be parallel to the optical path from the concave mirror 64b to the ¼-wavelength mirror 74a and the optical path from the ¼-wavelength mirror 74b to the concave mirror 64c.

Figure 8:
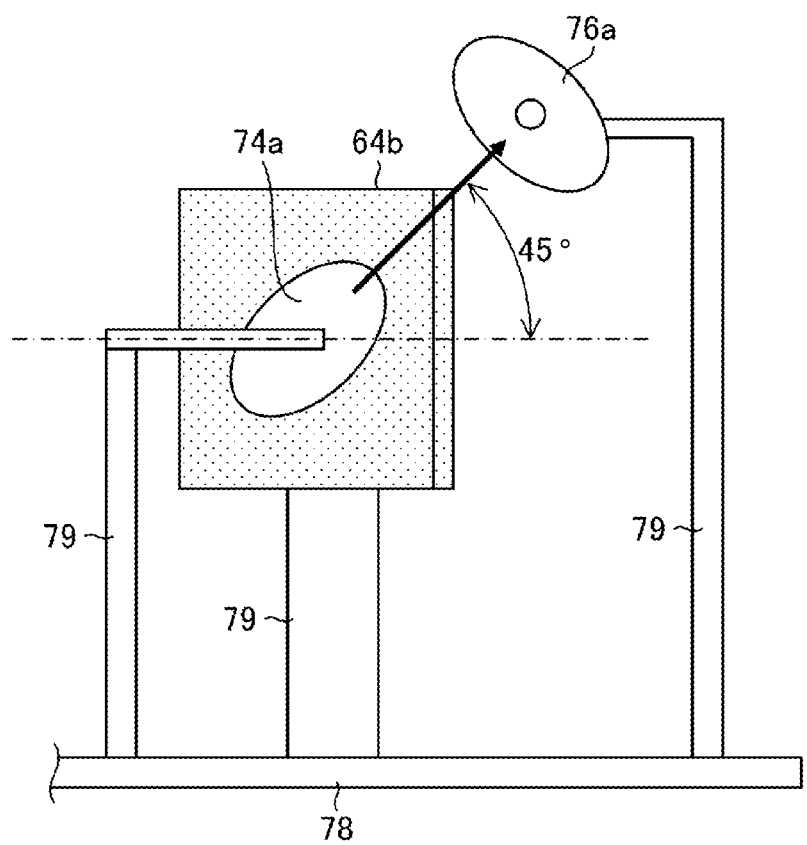
FIG. 8 is a diagram illustrating a modification of the positional relation between a ¼-wavelength mirror and a high reflective mirror.
Figure 9:
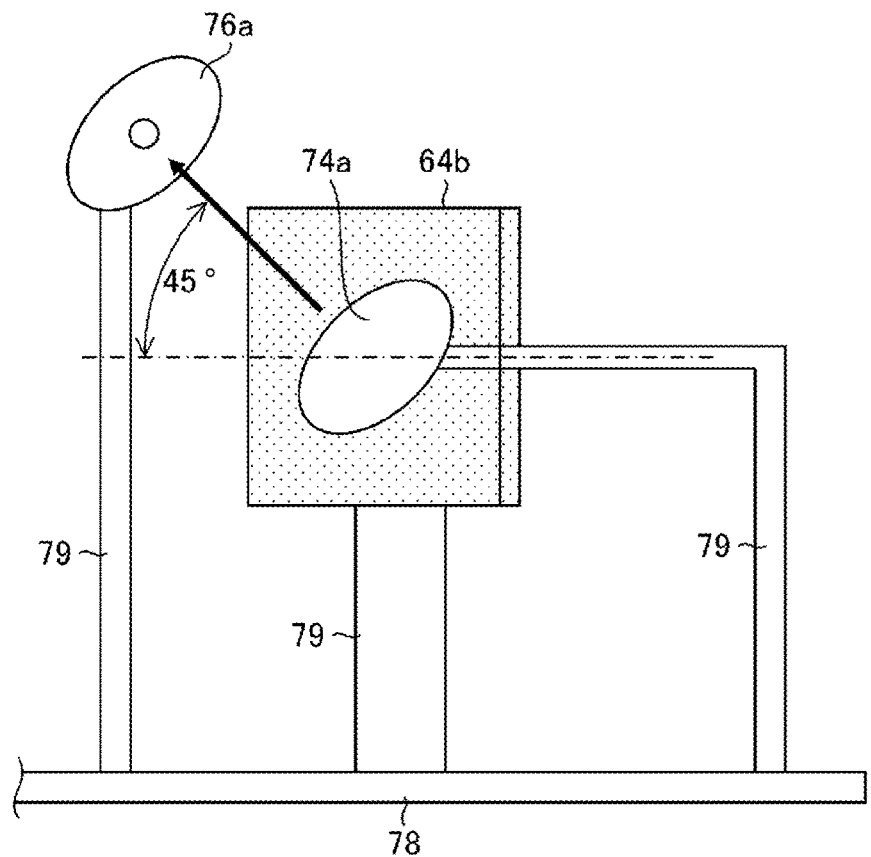
FIG. 9 is a diagram illustrating another modification of the positional relation between the ¼-wavelength mirror and the high reflective mirror.
Figure 10:
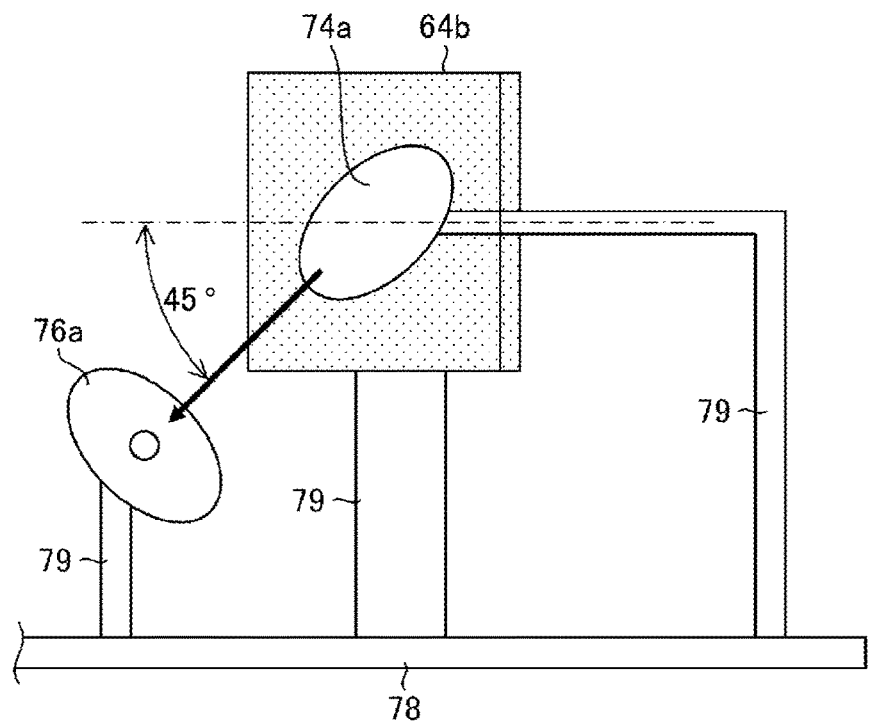
FIG. 10 is a diagram illustrating another modification of the positional relation between the ¼-wavelength mirror and the high reflective mirror.

Note that the positional relation between the ¼-wavelength mirror 74a and the high reflective mirror 76a is not limited to the example illustrated in FIG. 7, and it suffices that the ¼-wavelength mirror 74a bends the optical path of a pulse laser beam at an angle of 45° and directs the pulse laser beam to the high reflective mirror 76a. For example, the ¼-wavelength mirror 74a may be disposed as illustrated in FIGS. 8, 9, and 10. Similarly, the high reflective mirror 76b may be disposed relative to the ¼-wavelength mirror 74b as illustrated in FIGS. 8, 9, and 10.

4.2 Operation

Operation of the double path OPS 70 will be described below. A pulse laser beam having S-polarization is incident on the double path OPS 70. In FIG. 6, S-polarization is linear polarization orthogonal to the sheet, and P-polarization is linear polarization along the sheet.

The S-polarized pulse laser beam incident on the double path OPS 70 is incident on the first surface of the polarization beam splitter 72. The polarization beam splitter 72 reflects the incident S-polarized pulse laser beam at 60% and transmits the pulse laser beam at 40%. The 40% S-polarized pulse laser beam transmitted through the polarization beam splitter 72 is output from the double path OPS 70 as a first pulse laser beam of zero-round light not having completed a round through the delay optical path.

The 60% S-polarized pulse laser beam reflected by the polarization beam splitter 72 is reflected by the concave mirror 64a and the concave mirror 64b and incident on the ¼-wavelength mirror 74a.

The ¼-wavelength mirror 74a provides ¼-wavelength phase modulation to each polarization component of the incident pulse laser beam through tilting at 45° relative to the electric field oscillation axis of the pulse laser beam, thereby converting the S-polarized pulse laser beam into a circularly polarized pulse laser beam.

The pulse laser beam converted into circular polarization is reflected by the high reflective mirror 76a and the high reflective mirror 76b at high reflectance without phase change and incident on the ¼-wavelength mirror 74b. The optical image of the pulse laser beam reflected by the first surface of the polarization beam splitter 72 is transferred through the concave mirror 64a, the concave mirror 64b, and the ¼-wavelength mirror 74a to the intermediate position between the high reflective mirror 76a and the high reflective mirror 76b on the optical path at 1:1 as a first transfer image.

The ¼-wavelength mirror 74b provides further ¼-wavelength phase modulation to each polarization component of the circularly polarized pulse laser beam incident from the high reflective mirror 76b, thereby converting the circularly polarized pulse laser beam into a P-polarized pulse laser beam.

The pulse laser beam converted into P-polarization is reflected by the concave mirror 64c and the concave mirror 64d and incident on the second surface of the polarization beam splitter 72 perpendicularly to the optical axis of the input pulse laser beam. At this point, the pulse laser beam completes one round of the delay optical path. The first transfer image is transferred through the ¼-wavelength mirror 74b, the concave mirror 64c, and the concave mirror 64d to the second surface of the polarization beam splitter 72 at 1:1 as a second transfer image.

In this manner, the optical path through which the image of the input pulse laser beam on the first surface of the polarization beam splitter 72 is transferred as the first transfer image and the optical path through which the first transfer image is transferred to the second surface of the polarization beam splitter 72 as the second transfer image are symmetric with respect to the optical path of the output pulse laser beam. More preferably, the optical path through which the image of the input pulse laser beam on the first surface of the polarization beam splitter 72 is transferred as the first transfer image and the optical path through which the first transfer image is transferred to the second surface of the polarization beam splitter 72 as the second transfer image are disposed in a line symmetric manner with respect to the optical path of the output pulse laser beam.

The P-polarized pulse laser beam reflected by the concave mirror 64d and incident on the second surface of the polarization beam splitter 72 is transmitted through the polarization beam splitter 72 at substantially 100%, enters the second round of the delay optical path, and is incident on the concave mirror 64a.

The concave mirror 64a and the concave mirror 64b reflect the incident pulse laser beam to the ¼-wavelength mirror 74a. The ¼-wavelength mirror 74a converts the P-polarized pulse laser beam into a circularly polarized pulse laser beam. The pulse laser beam converted into circular polarization is reflected by the high reflective mirror 76a and the high reflective mirror 76b at high reflectance without phase change and incident on the ¼-wavelength mirror 74b.

The second transfer image is transferred through the concave mirror 64a, the concave mirror 64b, and the ¼-wavelength mirror 74a to the intermediate position between the high reflective mirror 76a and the high reflective mirror 76b at 1:1 as a third transfer image.

The ¼-wavelength mirror 74b provides further ¼-wavelength phase modulation to each polarization component of the circularly polarized pulse laser beam incident from the high reflective mirror 76b, thereby converting the circularly polarized pulse laser beam into an S-polarized pulse laser beam. The pulse laser beam converted into S-polarization is reflected by the concave mirror 64c and the concave mirror 64d and incident on the second surface of the polarization beam splitter 72 again. At this point, the pulse laser beam completes two rounds through the delay optical path. The third transfer image is transferred through the ¼-wavelength mirror 74b, the concave mirror 64c, and the concave mirror 64d to the position of the polarization beam splitter 72 at 1:1 as a fourth transfer image.

An S-polarized pulse laser beam that is 60% of the S-polarized pulse laser beam reflected by the concave mirror 64d and incident on the second surface of the polarization beam splitter 72 is reflected by the second surface of the polarization beam splitter 72. The S-polarized pulse laser beam reflected by the second surface of the polarization beam splitter 72 is output from the double path OPS 70 as a second pulse laser beam of two-round light having completed two rounds through the delay optical path.

The second pulse laser beam is output behind the first pulse laser beam by a delay time $\Delta t_2$. The delay time $\Delta t_2$ can be expressed as $2 \times L_{OPS3}/c$, where $L_{OPS3}$ represents the one-round delay optical path length of the delay optical path of the double path OPS 70 and c represents the speed of light.

An S-polarized pulse laser beam that is 40% of the S-polarized pulse laser beam reflected by the concave mirror 64d and incident on the second surface of the polarization beam splitter 72 is transmitted through the polarization beam splitter 72 and then enters the delay optical path.

Thereafter, the third to n-th pulse laser beams are output from the double path OPS 70 as light repeats rounds through the delay optical path.

Figure 11:
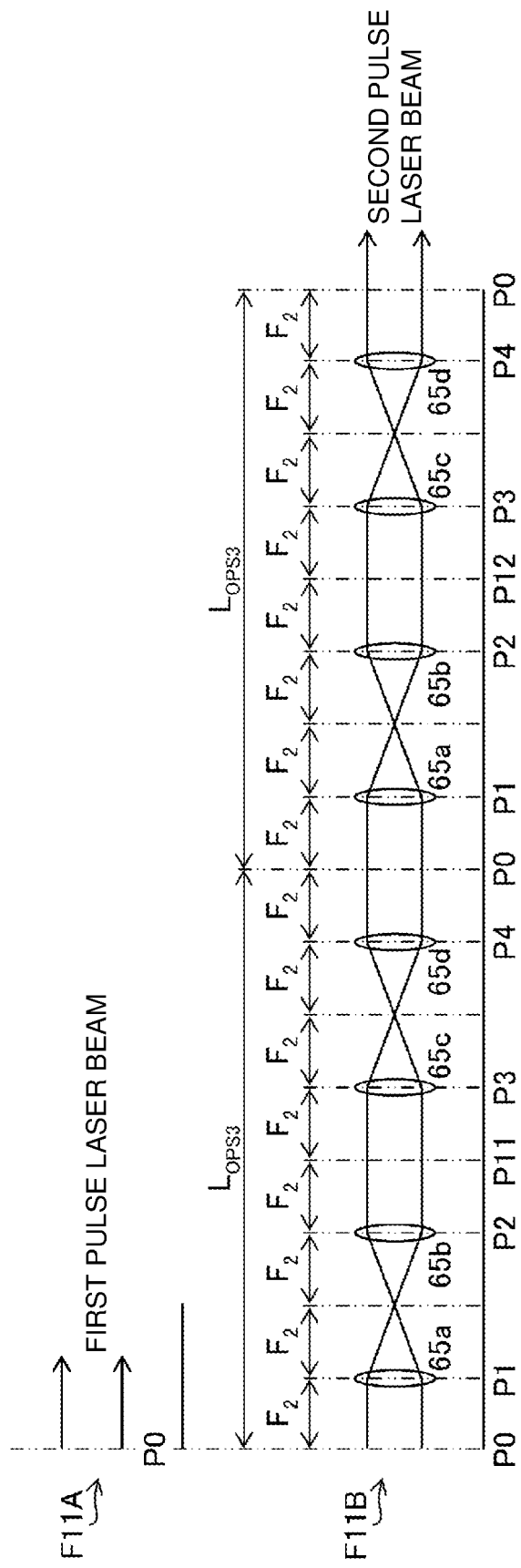
FIG. 11 is a diagram illustrating the optical paths of a first pulse laser beam and a second pulse laser beam output from the double path OPS.

FIG. 11 is a diagram illustrating the optical paths of the first pulse laser beam and the second pulse laser beam output from the double path OPS 70. In illustration of FIG. 11, the concave mirror 64a, the concave mirror 64b, the concave mirror 64c, and the concave mirror 64d are replaced with a convex lens 65a, a convex lens 65b, a convex lens 65c, and a convex lens 65d, each having the focal length $F_2$.

In FIG. 11, PO represents the position of the polarization beam splitter 72. In FIG. 11, P1, P2, P3, and P4 represent the positions of the concave mirror 64a, the concave mirror 64b, the concave mirror 64c, and the concave mirror 64d, respectively. In FIG. 11, P11 and P12 represent a position to which the first transfer image is transferred and a position to which the third transfer image is transferred, respectively.

In FIG. 11, F11A indicates the first pulse laser beam, and F11B indicates the second pulse laser beam. As illustrated in FIG. 11, the optical path lengths of the first pulse laser beam and the second pulse laser beam are different from each other by two one-round delay optical path lengths ($16F_2$).

4.3 Effect

In the double path OPS 70, an S-polarized pulse laser beam reflected by the polarization beam splitter 72 and incident on the delay optical path is converted into a P-polarized pulse laser beam through two reflections at the ¼-wavelength mirror 74a and the ¼-wavelength mirror 74b. Accordingly, the pulse laser beam having completed one round through the delay optical path and returned to the polarization beam splitter 72 is transmitted through the polarization beam splitter 72 and completes a round through the delay optical path again. As a result, light propagation distance inside the double path OPS 70 is approximately twice as long as the optical path length of the conventional OPS 60 in which the four concave mirrors 64 are disposed in a similar manner. Thus, the pulse width can be expanded with space saving.

Furthermore, since an image on the polarization beam splitter 72 is transferred to the intermediate position between the high reflective mirror 76a and the high reflective mirror 76b at 1:1 and transferred to the position of the polarization beam splitter 72 at 1:1 again, the pulse width can be expanded without increase of the beam diameter of a pulse laser beam.

Moreover, since the optical path in the double path OPS 70 extends in a single direction, light having completed a round through the delay optical path and returned to the beam splitter is not returned to the input side. Thus, the resonator of the PO 30 and the resonator of the MO 10 are not adversely affected by return light.

In addition, a ¼-wavelength mirror advantageously has excellent durability in the wavelength band of an ArF laser beam.

5. Embodiment 2

A double path OPS 80 according to Embodiment 2 will be described below. Hereinafter, a part common to that of the OPS 70 is denoted by the same reference sign, and detailed description thereof is omitted.

5.1 Configuration

Figure 12:
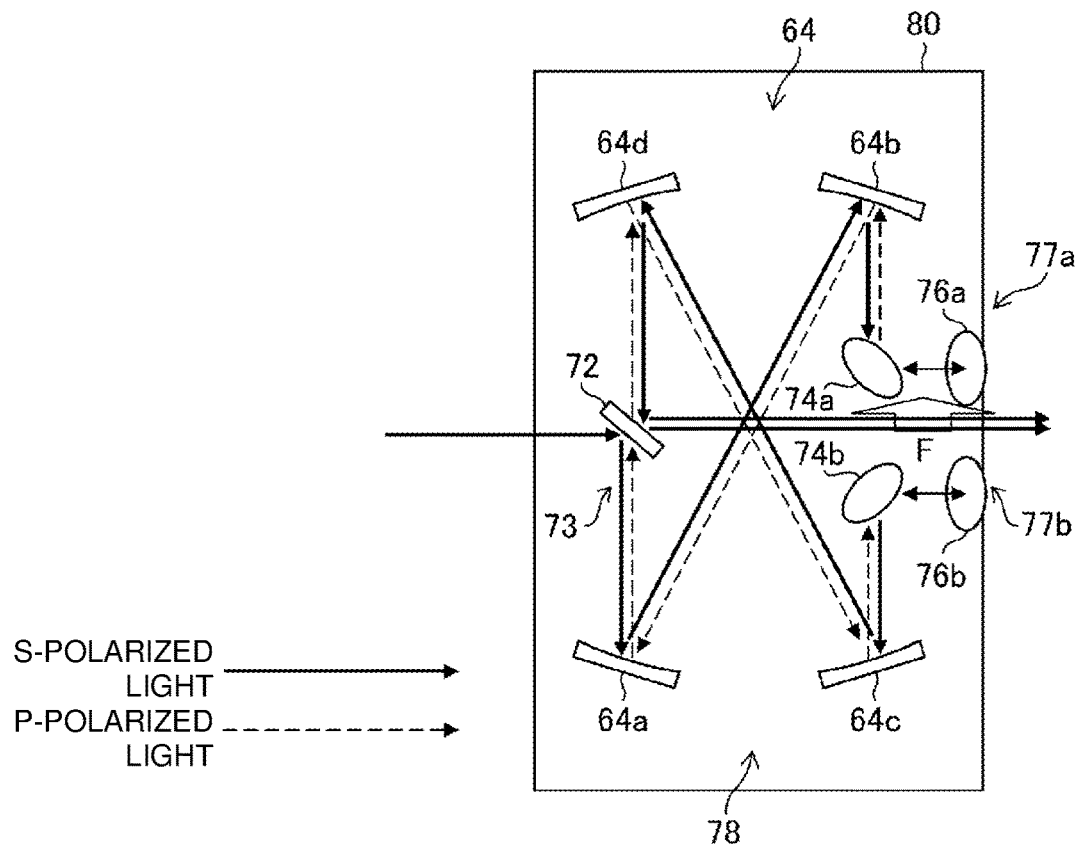
FIG. 12 is a diagram illustrating the configuration of a double path OPS according to Embodiment 2.

FIG. 12 is a diagram illustrating the configuration of the double path OPS 80 according to Embodiment 2. As illustrated in FIG. 12, the double path OPS 80 includes the polarization beam splitter 72, the transfer optical system 73, and the optical plate 78.

The transfer optical system 73 includes a first transfer optical system 77a and a second transfer optical system 77b. The first transfer optical system 77a includes the ¼-wavelength mirror 74a and the high reflective mirror 76a. The second transfer optical system 77b includes the ¼-wavelength mirror 74b and the high reflective mirror 76b.

The concave mirror 64a and the concave mirror 64b are disposed so that a pulse laser beam reflected by the polarization beam splitter 72 is reflected by the concave mirror 64a and incident on the concave mirror 64b. The concave mirror 64b is disposed so that the pulse laser beam reflected by the concave mirror 64b is incident on the ¼-wavelength mirror 74a.

The ¼-wavelength mirror 74a and the high reflective mirror 76a are disposed so that the pulse laser beam reflected by the concave mirror 64b is reflected by the ¼-wavelength mirror 74a and incident on the high reflective mirror 76a. In addition, the high reflective mirror 76a is disposed so that the pulse laser beam reflected by the ¼-wavelength mirror 74a is incident on the ¼-wavelength mirror 74a and incident on the polarization beam splitter 72 again.

The concave mirror 64d and the concave mirror 64c are disposed so that the pulse laser beam reflected by the concave mirror 64a and transmitted through the polarization beam splitter 72 is reflected by the concave mirror 64d and incident on the concave mirror 64c.

The ¼-wavelength mirror 74b and the high reflective mirror 76b are disposed so that the pulse laser beam reflected by the concave mirror 64c is reflected by the ¼-wavelength mirror 74b and incident on the high reflective mirror 76b. In addition, the high reflective mirror 76b is disposed so that the pulse laser beam reflected by the ¼-wavelength mirror 74b is incident on the ¼-wavelength mirror 74b and incident on the polarization beam splitter 72 again.

The distance between the polarization beam splitter 72 and the concave mirror 64a and the distance between the polarization beam splitter 72 and the concave mirror 64d are equal to the focal length $F_2$. The distance between the concave mirror 64a and the concave mirror 64b and the distance between the concave mirror 64c and the concave mirror 64d are each two times longer than the focal length $F_2$. The distance between the concave mirror 64b and the high reflective mirror 76a on the optical path and the distance between the concave mirror 64c and the high reflective mirror 76b on the optical path are each equal to the focal length $F_2$.

The concave mirror 64a, the concave mirror 64b, and the ¼-wavelength mirror 74a are configured so that an image on the first surface of the polarization beam splitter 72 is transferred to the high reflective mirror 76a at 1:1 as a first image.

The high reflective mirror 76a, the ¼-wavelength mirror 74a, the concave mirror 64b, and the concave mirror 64a are configured so that the first image is transferred to the first surface of the polarization beam splitter 72 at 1:1 as a second image.

The concave mirror 64d, the concave mirror 64c, and the ¼-wavelength mirror 74b are configured so that an image on the first surface of the polarization beam splitter 72 is transferred to the high reflective mirror 76b at 1:1 as a third image.

The high reflective mirror 76b, the ¼-wavelength mirror 74b, the concave mirror 64c, and the concave mirror 64d are configured so that the third image is transferred to the second surface of the polarization beam splitter 72 at 1:1 as a fourth image.

5.1.1 Disposition of ¼-Wavelength Mirror and High Reflective Mirror

The optical path from the ¼-wavelength mirror 74a to the high reflective mirror 76a is set to have an angle of 45° relative to the optical path up to the ¼-wavelength mirror 74a.

Figure 13:
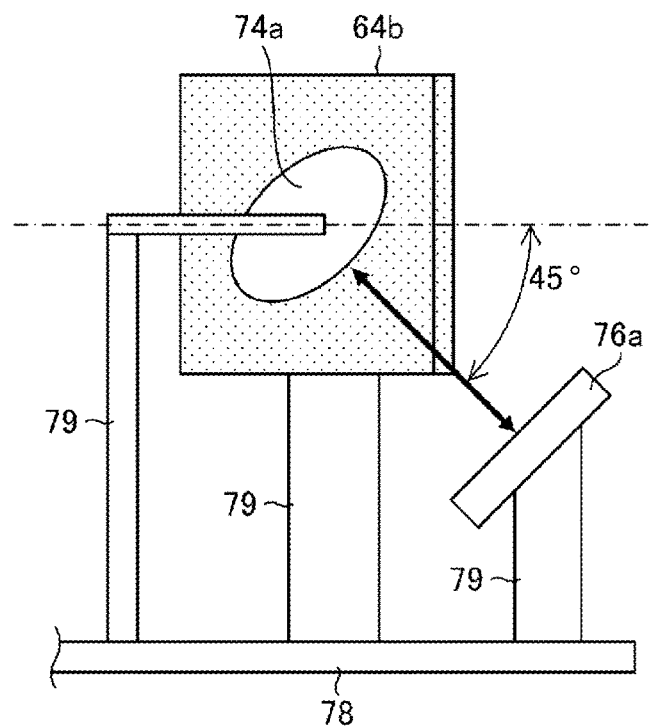
FIG. 13 is a diagram viewed in the direction of arrow F in FIG. 12.

FIG. 13 is a diagram viewed in the direction of arrow F in FIG. 12. As illustrated in FIG. 13, the high reflective mirror 76a is disposed on the optical plate 78 side of the ¼-wavelength mirror 74a at an angle of 45° relative to a horizontal direction illustrated in FIG. 13. The ¼-wavelength mirror 74a bends the optical path of a pulse laser beam at an angle of 45° toward the optical plate 78 side and directs the pulse laser beam to the high reflective mirror 76a.

Similarly, the optical path from the ¼-wavelength mirror 74b to the high reflective mirror 76b is set to have an angle of 45° relative to the optical path up to the ¼-wavelength mirror 74b.

Note that the positional relation between the ¼-wavelength mirror 74a and the high reflective mirror 76a is not limited to the example illustrated in FIG. 13, and it suffices that the ¼-wavelength mirror 74a bends the optical path of a pulse laser beam at an angle of 45° toward the optical plate 78 side and directs the pulse laser beam to the high reflective mirror 76a.

5.2 Operation

Operation of the double path OPS 80 will be described below. An S-polarized pulse laser beam is incident on the double path OPS 80.

The S-polarized pulse laser beam incident on the double path OPS 80 is incident on the first surface of the polarization beam splitter 72. The 40% S-polarized pulse laser beam transmitted through the polarization beam splitter 72 is output from the double path OPS 80 as a first pulse laser beam of zero-round light not having completed a round through the delay optical path.

The 60% S-polarized pulse laser beam reflected by the polarization beam splitter 72 is reflected by the concave mirror 64a and the concave mirror 64b and incident on the ¼-wavelength mirror 74a.

The ¼-wavelength mirror 74a converts the incident pulse laser beam into a circularly polarized pulse laser beam. The pulse laser beam converted into circular polarization is incident on the high reflective mirror 76a. The optical image of the pulse laser beam reflected by the polarization beam splitter 72 is transferred to the high reflective mirror 76a at 1:1 as a first transfer image.

The incident pulse laser beam is reflected by the high reflective mirror 76a at high reflectance without phase change and incident on the ¼-wavelength mirror 74a again.

The ¼-wavelength mirror 74a converts the circularly polarized pulse laser beam incident from the high reflective mirror 76a into a P-polarized pulse laser beam. The pulse laser beam converted into P-polarization is incident on the concave mirror 64b, reflected by the concave mirror 64b and the concave mirror 64a, and incident on the first surface of the polarization beam splitter 72. At this point, the pulse laser beam completes one round through the delay optical path. The first transfer image is transferred to the first surface of the polarization beam splitter 72 at 1:1 as a second transfer image.

The P-polarized pulse laser beam reflected by the concave mirror 64a and incident on the first surface of the polarization beam splitter 72 is transmitted through the polarization beam splitter 72 at substantially 100%, enters the second round through the delay optical path, and is incident on the concave mirror 64d.

The P-polarized pulse laser beam incident on the concave mirror 64d is reflected by the concave mirror 64d and the concave mirror 64c and incident on the ¼-wavelength mirror 74b.

The ¼-wavelength mirror 74b converts the incident pulse laser beam into a circularly polarized pulse laser beam. The pulse laser beam converted into circular polarization is incident on the high reflective mirror 76b. The second transfer image is transferred to the high reflective mirror 76b at 1:1 as a third transfer image.

The incident pulse laser beam is reflected by the high reflective mirror 76b at high reflectance without phase change and incident on the ¼-wavelength mirror 74b again.

The ¼-wavelength mirror 74b converts the circularly polarized pulse laser beam incident from the high reflective mirror 76b into a P-polarized pulse laser beam. The pulse laser beam converted into P-polarization is incident on the concave mirror 64c, reflected by the concave mirror 64c and the concave mirror 64d, and incident on the second surface of the polarization beam splitter 72. At this point, the pulse laser beam completes two rounds through the delay optical path. The third transfer image is transferred to the second surface of the polarization beam splitter 72 at 1:1 as a fourth transfer image.

In this manner, the optical path through which the image of an input pulse laser beam on the first surface of the polarization beam splitter 72 is transferred to the high reflective mirror 76a as the first transfer image and the optical path through which the second transfer image on the first surface of the polarization beam splitter 72 is transferred to the high reflective mirror 76b as the third transfer image are symmetric with respect to the optical path of an output pulse laser beam. More preferably, the optical path through which the image of an input pulse laser beam on the first surface of the polarization beam splitter 72 is transferred to the high reflective mirror 76a as the first transfer image and the optical path through which the second transfer image on the first surface of the polarization beam splitter 72 is transferred to the high reflective mirror 76b as the third transfer image are disposed in a line symmetric manner with respect to the optical path of an output pulse laser beam.

An S-polarized pulse laser beam that is 60% of the S-polarized pulse laser beam reflected by the concave mirror 64d and incident on the second surface of the polarization beam splitter 72 is reflected by the second surface of the polarization beam splitter 72. The S-polarized pulse laser beam reflected by the second surface of the polarization beam splitter 72 is output from the double path OPS 80 as a second pulse laser beam of two-round light having completed two rounds through the delay optical path.

The second pulse laser beam is output behind the first pulse laser beam by a delay time $\Delta t_3$. The delay time $\Delta t_3$ can be expressed as $2 \times L_{OPS4}/c$, where $L_{OPS4}$ represents the one-round delay optical path length of the delay optical path of the double path OPS 80 and c represents the speed of light.

An S-polarized pulse laser beam that is 40% of the S-polarized pulse laser beam reflected by the concave mirror 64d and incident on the second surface of the polarization beam splitter 72 is transmitted through the polarization beam splitter 72 and then enters the delay optical path.

Thereafter, the third to n-th pulse laser beams are output from the double path OPS 80 as light repeats rounds through the delay optical path.

Figure 14:
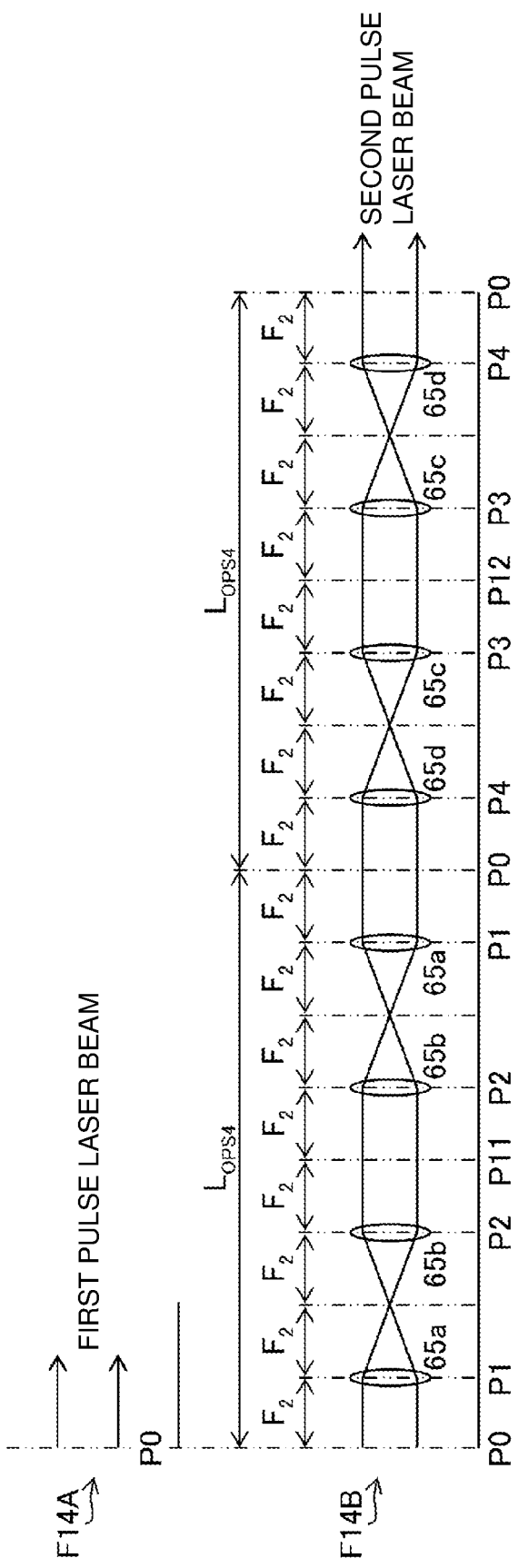
FIG. 14 is a diagram illustrating the optical paths of a first pulse laser beam and a second pulse laser beam output from the double path OPS.

FIG. 14 is a diagram illustrating the optical paths of the first pulse laser beam and the second pulse laser beam output from the double path OPS 80. A part common to that of FIG. 11 is denoted by the same reference sign, and detailed description thereof is omitted.

In FIG. 14, F14A indicates the first pulse laser beam, and F14B indicates the second pulse laser beam. As illustrated in FIG. 14, the optical path lengths of the first pulse laser beam and the second pulse laser beam are different from each other by two one-round delay optical path lengths ($16F_2$).

5.3 Effect

In the double path OPS 80, an S-polarized pulse laser beam reflected by the polarization beam splitter 72 is converted into a P-polarized pulse laser beam through two reflections at the ¼-wavelength mirror 74a. Accordingly, the pulse laser beam returned to the polarization beam splitter 72 is transmitted through the polarization beam splitter 72 and reflected twice by the ¼-wavelength mirror 74b. As a result, light propagation distance inside the double path OPS 80 is approximately twice as long as the optical path length of the conventional OPS 60 in which the four concave mirrors 64 are disposed in a similar manner. Thus, the pulse width can be expanded with space saving.

Figure 15:
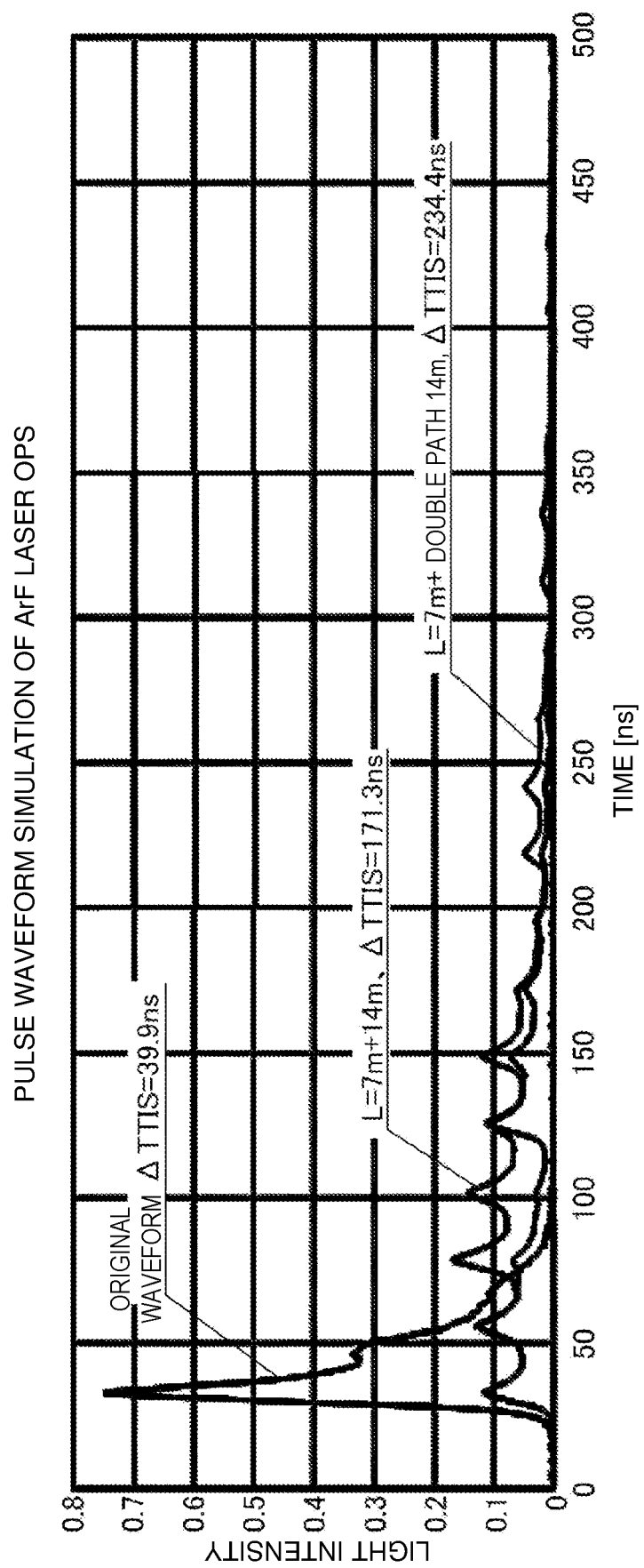
FIG. 15 is a diagram illustrating a simulation result of pulse waveform expansion of an output pulse laser beam of the laser system.

FIG. 15 is a diagram illustrating a simulation result of pulse waveform expansion of an output pulse laser beam in the laser system 1 when the double path OPS 80 is applied in place of the OPS 60. FIG. 15 illustrates simulation results of pulse waveform expansion of an input pulse laser beam to the OPS 50 and an output pulse laser beam in the laser system 1 illustrated in FIG. 5. In this example, the one-round delay optical path length $L_{OPS1}$ of the OPS 50 is 7 m, the one-round delay optical path length $L_{OPS2}$ of the OPS 60 is 14 m, and the one-round delay optical path length $L_{OPS4}$ of the double path OPS 80 is 14 m. In other words, the light propagation distance of the double path OPS 80 is 28 m.

As illustrated in FIG. 15, it was observed that the pulse width of an input pulse laser beam to the OPS 50, which is 40 ns, can be expanded to 234 ns when the OPS 50 and the double path OPS 80 are combined. In addition, it was observed that the pulse width can be expanded from 171 ns to 234 ns when the OPS 60 is replaced with the double path OPS 80. Accordingly, improvement of the speckle contrast from 5.7% to 5.1% can be estimated.

6. Modification 1 of Embodiment 2

6.1 Configuration

Figure 16:
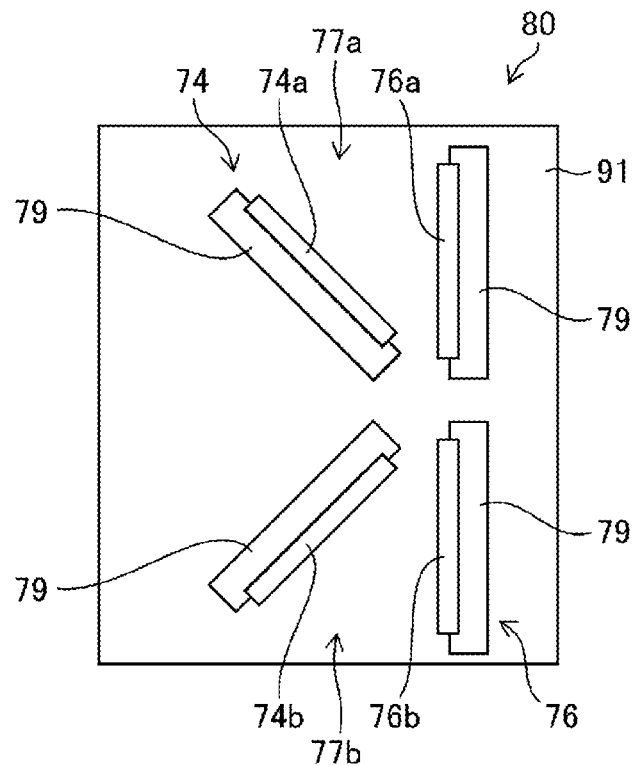
FIG. 16 is a partial top view of a double path OPS according to Modification 1 of Embodiment 2.
Figure 17:
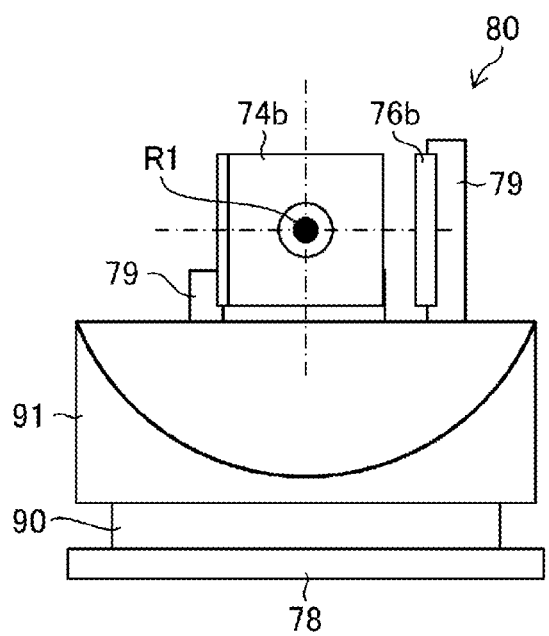
FIG. 17 is a partial side view of the double path OPS according to Modification 1 of Embodiment 2.

FIG. 16 is a partial top view of the double path OPS 80 according to Modification 1 of Embodiment 2. FIG. 16 illustrates a part in which the ¼-wavelength mirror 74a, the ¼-wavelength mirror 74b, the high reflective mirror 76a, and the high reflective mirror 76b are held. FIG. 17 is a partial side view of the double path OPS 80 illustrated in FIG. 16. Note that a part common to that of the double path OPS 80 according to Embodiment 2 is denoted by the same reference sign, and detailed description thereof is omitted.

The double path OPS 80 includes an XYZ stage 90 and a gonio stage 91.

The ¼-wavelength mirror 74a, the ¼-wavelength mirror 74b, the high reflective mirror 76a, and the high reflective mirror 76b are each held by the holder 79. Each holder 79 includes a two-axis tilt adjustment mechanism.

Each holder 79 is positioned on the gonio stage 91. The gonio stage 91 is rotatable about a rotational axis $R_1$. The position of each holder 79 is defined so that the rotational axis $R_1$ of the gonio stage 91 aligns with the incidence-emission optical axes of the ¼-wavelength mirror 74a and the ¼-wavelength mirror 74b.

The gonio stage 91 is placed on the XYZ stage 90. The XYZ stage 90 is movable in three directions orthogonal to one another.

6.2 Operation

Figure 18:
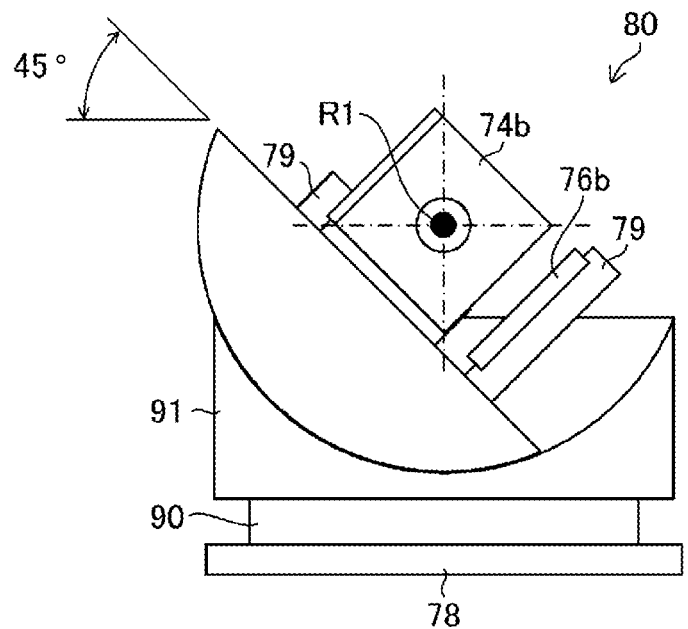
FIG. 18 is a partial side view illustrating a state after a gonio stage is adjusted.

The holders 79, the XYZ stage 90, and the gonio stage 91 are adjusted so that an S-polarized pulse laser beam is incident on the ¼-wavelength mirror 74a, converted into a P-polarized pulse laser beam, and output from the ¼-wavelength mirror 74a coaxially with an incident optical axis. In this case, the gonio stage 91 is adjusted so that the optical axis between the ¼-wavelength mirror 74a and the high reflective mirror 76a and the optical axis between the ¼-wavelength mirror 74b and the high reflective mirror 76b have an angle of 45° relative to both a direction orthogonal to the sheet of FIG. 16 and a direction along the sheet. An adjustment apparatus with which an S-polarized pulse laser beam is incident on the ¼-wavelength mirror 74a and the pulse laser beam output from the ¼-wavelength mirror 74a is monitored by a polarization photometer may be separately provided. FIG. 18 is a partial side view illustrating a state after the gonio stage 91 is adjusted.

Subsequently, the adjusted orientation of the incidence-emission optical axis of the ¼-wavelength mirror 74a is changed by 180° through 180° rotation while the orientation of a support surface of the optical plate 78 is fixed. Subsequently, the holders 79 and the XYZ stage 90 are adjusted so that an S-polarized pulse laser beam is incident on the ¼-wavelength mirror 74b, converted into a P-polarized pulse laser beam, and output from the ¼-wavelength mirror 74b coaxially with an incident optical axis. In this example, the gonio stage 91 maintains an angle adjusted so that an S-polarized pulse laser beam is incident on the ¼-wavelength mirror 74a, and no further adjustment is not performed.

This adjustment may be performed at a factory or the like before assembly with the excimer laser apparatus 2.

6.3 Effect

Since the OPS 80 of Modification 1 of Embodiment 2 includes an adjustment mechanism constituted by the holders 79, the XYZ stage 90, and the gonio stage 91, the position and posture of each optical element can be adjusted to reduce unnecessary light due to polarization error. In particular, since the gonio stage 91 is provided, the rotation state of polarization can be easily adjusted.

7. Modification 2 of Embodiment 2

7.1 Configuration

Figure 19:
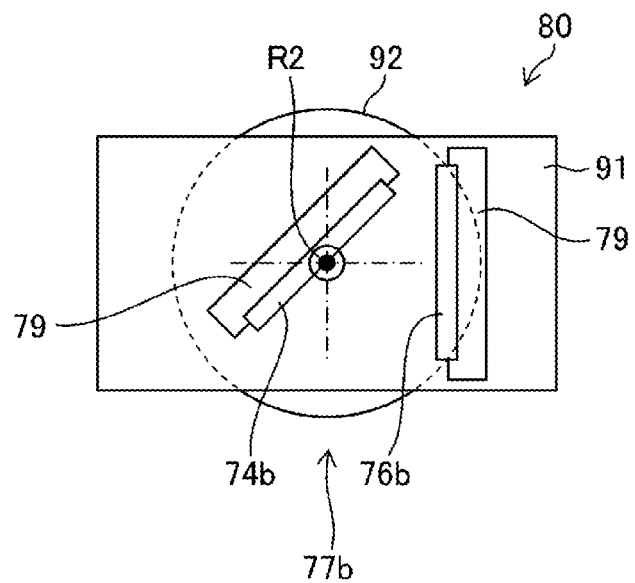
FIG. 19 is a partial top view of a double path OPS according to Modification 2 of Embodiment 2.
Figure 20:
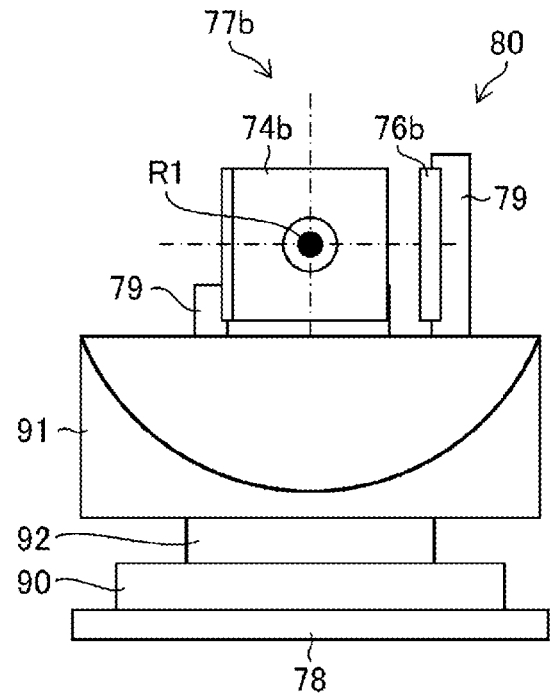
FIG. 20 is a partial side view of the double path OPS according to Modification 1.

FIG. 19 is a partial top view of the double path OPS 80 according to Modification 2 of Embodiment 2. FIG. 19 illustrates a part in which the ¼-wavelength mirror 74b and the high reflective mirror 76b are held. FIG. 20 is a partial side view of the double path OPS 80 illustrated in FIG. 19. Note that a part common to that of the double path OPS 80 according to Modification 1 of Embodiment 2 is denoted by the same reference sign, and detailed description thereof is omitted.

The double path OPS 80 includes the XYZ stage 90, the gonio stage 91, and a rotation stage 92 for the second transfer optical system 77b. The second transfer optical system 77b is disposed on the gonio stage 91. The gonio stage 91 is placed on the rotation stage 92. The rotation stage 92 is placed on the XYZ stage 90.

The position of each holder 79 is defined so that the rotational axis $R_1$ of the gonio stage 91 aligns with the incidence-emission optical axis of the ¼-wavelength mirror 74b.

The position of each holder 79 is defined so that a rotational axis $R_2$ of the rotation stage 92 passes through an intersection point between the incidence-emission optical axis of the ¼-wavelength mirror 74b for the concave mirror 64c and the incidence-emission optical axis of the high reflective mirror 76b.

Although not illustrated, the same configuration may be provided for the first transfer optical system 77a. In this case, the XYZ stage 90, the gonio stage 91, and the rotation stage 92 on which the first transfer optical system 77a is placed correspond to a first XYZ stage, a first gonio stage, and a first rotation stage, respectively. Similarly, the XYZ stage 90, the gonio stage 91, and the rotation stage 92 on which the second transfer optical system 77b is placed correspond to a second XYZ stage, a second gonio stage, and a second rotation stage, respectively.

7.2 Operation

Figure 21:
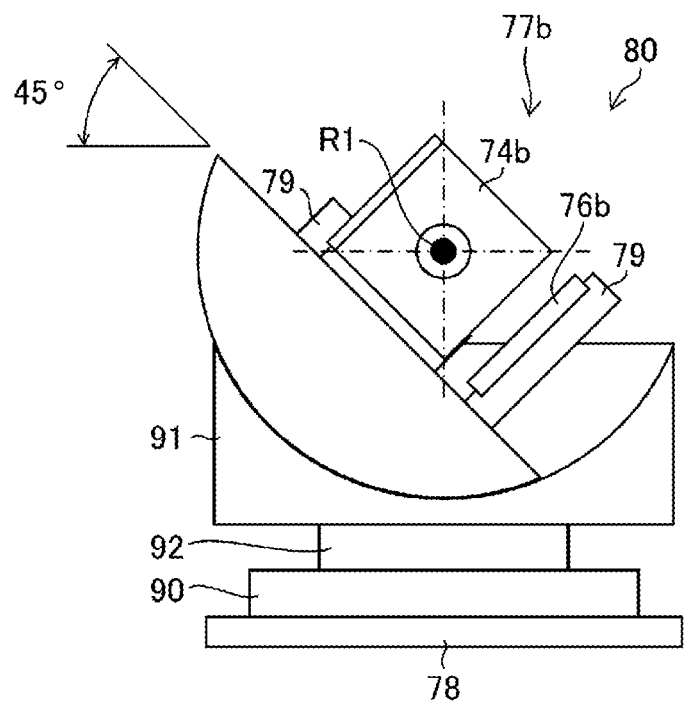
FIG. 21 is a partial side view illustrating a state after the gonio stage is adjusted.

The holders 79, the XYZ stage 90, the gonio stage 91, and the rotation stage 92 are adjusted so that an S-polarized pulse laser beam incident on the ¼-wavelength mirror 74b is converted into a P-polarized pulse laser beam and output from the ¼-wavelength mirror 74b coaxially with an incident optical axis. FIG. 21 is a partial side view illustrating a state after the gonio stage 91 is adjusted.

Similarly, adjustment is performed for the first transfer optical system 77a.

7.3 Effect

According to Modification 2 of Embodiment 2, since adjustment of the first transfer optical system 77a and adjustment of the second transfer optical system 77b can be independently performed, the freedom of adjustment is high and polarization error due to machine difference of the double path OPS 80 can be easily corrected.

Note that Modification 1 of Embodiment 2 and Modification 2 of Embodiment 2 are applicable to Embodiment 1 by changing the postures of the high reflective mirror 76a and the high reflective mirror 76b.

8. Modification 3 of Embodiment 2

8.1 Configuration

Figure 22:
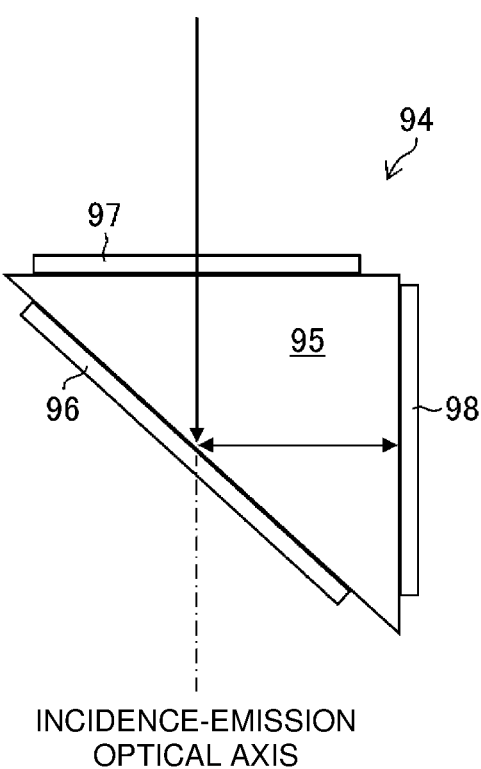
FIG. 22 is a top view of a 45° right angle prism element according to Modification 3 of Embodiment 2.

FIG. 22 is a top view of a 45° right angle prism element 94 according to Modification 3 of Embodiment 2. As illustrated in FIG. 22, the 45° right angle prism element 94 includes a prism unit 95, a ¼-wavelength mirror film 96, a reflection suppression film 97, and a high reflective film 98.

The prism unit 95 has a triangular prism shape of an isosceles right triangle when viewed from top. The material of the prism unit 95 contains at least one of $CaF_2$ and $SiO_2$.

The ¼-wavelength mirror film 96 is provided on a side surface of the triangular prism shape of the prism unit 95, the side surface serving as the hypotenuse of the isosceles right triangle. The reflection suppression film 97 is provided on a side surface of the triangular prism shape of the prism unit 95, the side surface serving as one of the adjacent sides of the isosceles right triangle. The high reflective film 98 is provided on a side surface of the triangular prism shape of the prism unit 95, the side surface serving as the other adjacent side of the isosceles right triangle.

The 45° right angle prism element 94 may be applied to the first transfer optical system 77a and the second transfer optical system 77b. For example, when the 45° right angle prism element 94 is applied to the first transfer optical system 77a, the ¼-wavelength mirror film 96 functions as the ¼-wavelength mirror 74a, and the high reflective film 98 functions as the high reflective mirror 76a.

The 45° right angle prism element 94 may be fixed to the holder 79 (refer to FIG. 13) that is rotatable about a rotational axis along the incidence-emission optical axis of the ¼-wavelength mirror film 96 or may be fixed to the gonio stage 91 (refer to FIG. 16) having a rotational axis along the incidence-emission optical axis of the ¼-wavelength mirror film 96.

8.2 Operation

A pulse laser beam is incident on the 45° right angle prism element 94 from the surface on which the reflection suppression film 97 is provided. The ¼-wavelength mirror film 96 is tilted at 45° relative to the electric field oscillation axis of the incident light to provide ¼-wavelength phase modulation to each polarization component of the incident light, thereby converting linear polarization into circular polarization. The pulse laser beam converted into circular polarization is incident on the high reflective film 98.

The pulse laser beam converted into circular polarization is reflected by the high reflective film 98 at high reflectance without phase change and incident on the ¼-wavelength mirror film 96 again.

The incident pulse laser beam is reflected by the high reflective film 98 at high reflectance without wavefront change and incident on the ¼-wavelength mirror film 96 again.

The ¼-wavelength mirror film 96 provides further ¼-wavelength phase modulation to each polarization component of the circularly polarized pulse laser beam incident from the high reflective film 98, thereby converting the circularly polarized pulse laser beam into a linearly polarized pulse laser beam. The pulse laser beam converted into linear polarization is incident on the reflection suppression film 97 and output from the 45° right angle prism element 94.

8.3 Effect

With the 45° right angle prism element 94, linear polarization can be converted into circular polarization through the first reflection at the ¼-wavelength mirror film 96, and the polarization direction can be rotated by 90° through the second reflection. In the 45° right angle prism element 94, the ¼-wavelength mirror film 96 and the high reflective film 98 are integrated, and thus position and posture adjustment can be easily performed.

9. Embodiment 3

A double path OPS 100 according to Embodiment 3 will be described below. In the following description, a part common to that of the double path OPS 80 of Embodiment 2 is denoted by the same reference sign, and detailed description thereof is omitted.

9.1 Configuration

Figure 23:
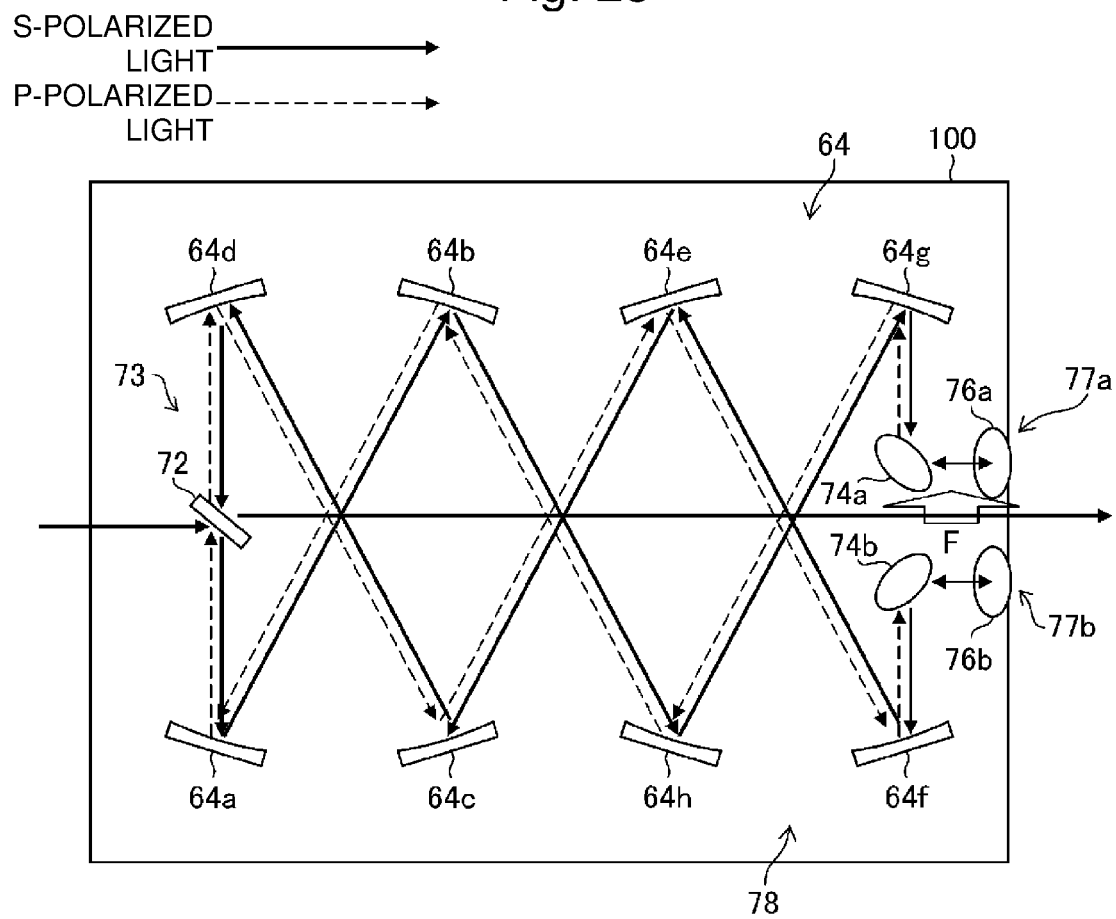
FIG. 23 is a diagram illustrating the configuration of a double path OPS according to Embodiment 3.

FIG. 23 is a diagram illustrating the configuration of the double path OPS 100. As illustrated in FIG. 23, the double path OPS 100 includes eight concave mirrors 64.

The eight concave mirrors 64 (an example of a plurality of concave mirrors) constitute a delay optical path for expanding the pulse width of a pulse laser beam. The eight concave mirrors 64 are a concave mirror 64a, a concave mirror 64b, a concave mirror 64c, a concave mirror 64d, a concave mirror 64e, a concave mirror 64f, a concave mirror 64g, and a concave mirror 64h. The eight concave mirrors 64 all have the focal length $F_2$.

The concave mirror 64a, the concave mirror 64b, the concave mirror 64h, and the concave mirror 64g are disposed so that a pulse laser beam reflected by the polarization beam splitter 72 is sequentially reflected by the concave mirror 64a, the concave mirror 64b, the concave mirror 64h, and the concave mirror 64g and incident on the ¼-wavelength mirror 74a.

The concave mirror 64d, the concave mirror 64c, the concave mirror 64e, and the concave mirror 64f are disposed so that the pulse laser beam reflected by the concave mirror 64a and transmitted through the polarization beam splitter 72 is sequentially reflected by the concave mirror 64d, the concave mirror 64c, the concave mirror 64e, and the concave mirror 64f and incident on the ¼-wavelength mirror 74b.

The distance between the polarization beam splitter 72 and the concave mirror 64a and the distance between the concave mirror 64d and the polarization beam splitter 72 are equal to the focal length $F_2$. The distance between the concave mirror 64a and the concave mirror 64b, the distance between the concave mirror 64b and the concave mirror 64h, the distance between the concave mirror 64h and the concave mirror 64g, the distance between the concave mirror 64d and the concave mirror 64c, the distance between the concave mirror 64c and the concave mirror 64e, and the distance between the concave mirror 64e and the concave mirror 64f are each two times longer than the focal length $F_2$. The distance between the concave mirror 64g and the high reflective mirror 76a on the optical path and the distance between the concave mirror 64f and the high reflective mirror 76b on the optical path are each equal to the focal length $F_2$.

The concave mirror 64a, the concave mirror 64b, the concave mirror 64h, and the concave mirror 64g are configured so that an image on the first surface of the polarization beam splitter 72 is transferred onto the high reflective mirror 76a at 1:1. The concave mirror 64d, the concave mirror 64c, the concave mirror 64e, and the concave mirror 64f are configured so that an image on the first surface of the polarization beam splitter 72 is transferred onto the high reflective mirror 76b at 1:1.

When $L_{OPS5}$ represents the one-round delay optical path length of the delay optical path of the double path OPS 100, $L_{OPS5}$ corresponds to $16F_2$.

9.2 Operation

Operation of the double path OPS 100 will be described below. An S-polarized pulse laser beam is incident on the double path OPS 100. The 40% S-polarized pulse laser beam transmitted through the polarization beam splitter 72 is output from the double path OPS 100 as a first pulse laser beam of zero-round light not having completed a round through the delay optical path.

The 60% S-polarized pulse laser beam reflected by the polarization beam splitter 72 is reflected by the concave mirror 64a, the concave mirror 64b, the concave mirror 64h, and the concave mirror 64g and incident on the first transfer optical system 77a. The optical image of the pulse laser beam reflected by the polarization beam splitter 72 is transferred to the high reflective mirror 76a at 1:1 as a first transfer image.

The pulse laser beam converted into P-polarization through the first transfer optical system 77a is reflected by the concave mirror 64g, the concave mirror 64h, the concave mirror 64b, and the concave mirror 64a and incident on the first surface of the polarization beam splitter 72. At this point, the pulse laser beam completes one round through the delay optical path. The first transfer image is transferred to the first surface of the polarization beam splitter 72 at 1:1 as a second transfer image.

The P-polarized pulse laser beam reflected by the concave mirror 64a and incident on the first surface of the polarization beam splitter 72 is transmitted through the polarization beam splitter 72 at substantially 100%, enters the second round through the delay optical path, and is incident on the concave mirror 64d.

The P-polarized pulse laser beam incident on the concave mirror 64d is reflected by the concave mirror 64d, the concave mirror 64c, the concave mirror 64e, and the concave mirror 64f and incident on the second transfer optical system 77b. The second transfer image is transferred to the high reflective mirror 76b at 1:1 as a third transfer image.

The pulse laser beam converted into S-polarization through the second transfer optical system 77b is incident on the concave mirror 64f, reflected by the concave mirror 64f, the concave mirror 64e, the concave mirror 64c, and the concave mirror 64d, and incident on the second surface of the polarization beam splitter 72. At this point, the pulse laser beam completes two rounds through the delay optical path. The third transfer image is transferred to the second surface of the polarization beam splitter 72 at 1:1 as a fourth transfer image.

An S-polarized pulse laser beam that is 60% of the S-polarized pulse laser beam reflected by the concave mirror 64d and incident on the second surface of the polarization beam splitter 72 is reflected by the second surface of the polarization beam splitter 72. The S-polarized pulse laser beam reflected by the second surface of the polarization beam splitter 72 is output from the double path OPS 100 as a second pulse laser beam of two-round light having completed two rounds through the delay optical path.

The second pulse laser beam is output behind the first pulse laser beam by a delay time $\Delta t_4$. The delay time $\Delta t_4$ can be expressed as $2 \times L_{OPS5}/c$, where $L_{OPS5}$ represents the one-round delay optical path length of the delay optical path of the double path OPS 100 and c represents the speed of light.

Thereafter, the third to n-th pulse laser beams are output from the double path OPS 100 as light repeats rounds through the delay optical path.

9.3 Effect

Since the concave mirror 64e, the concave mirror 64f, the concave mirror 64g, and the concave mirror 64h are added to the double path OPS 80, the optical path length for optical delay is extended.

10. Electronic Device Manufacturing Method

FIG. 24 is a diagram schematically illustrating an exemplary configuration of an exposure apparatus 302. An electronic device manufacturing method is achieved by the excimer laser apparatus 2, a pulse width expansion apparatus 300, and an exposure apparatus 302.

A pulse laser beam emitted from the excimer laser apparatus 2 is input to the pulse width expansion apparatus 300. The pulse width expansion apparatus 300 may include at least one of the double path OPS 70, the double path OPS 80, and the double path OPS 100 described in the embodiments.

The pulse laser beam is subjected to pulse width expansion through the excimer laser apparatus 2 and the pulse width expansion apparatus 300. The pulse laser beam subjected to pulse width expansion is input to the exposure apparatus 302 and used as exposure light.

The exposure apparatus 302 includes an illumination optical system 304 and a projection optical system 306. The illumination optical system 304 illuminates a reticle pattern on a reticle stage RT with the pulse laser beam incident from the pulse width expansion apparatus 3. The pulse laser beam transmitted through a reticle is subjected to reduced projection through the projection optical system 306 and imaged on a non-illustrated workpiece disposed on a workpiece table WT. The workpiece is a photosensitive substrate such as a semiconductor wafer to which photoresist is applied. The exposure apparatus 302 translates the reticle stage RT and the workpiece table WT in synchronization so that the workpiece is exposed to the pulse laser beam on which the reticle pattern is reflected. A semiconductor device can be manufactured by transferring a device pattern onto the semiconductor wafer through the exposure process as described above. The semiconductor device is an example of an "electronic device" in the present disclosure.

11. Other

Although an excimer laser apparatus is used as the MO 10 of the excimer laser apparatus 2, a solid-state laser apparatus may be used.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless otherwise stated. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A pulse width expansion apparatus comprising:
a polarization beam splitter configured to transmit a pulse laser beam having a first polarization direction in a linearly polarized pulse laser beam at a first transmittance, and reflect a pulse laser beam having a second polarization direction orthogonal to the first polarization direction at a first reflectance while transmitting the pulse laser beam having the second polarization direction at a second transmittance; and
a transfer optical system in which the pulse laser beam reflected by the polarization beam splitter is reflected by a plurality of concave mirrors and returned to the polarization beam splitter,
the polarization beam splitter being configured to synthesize and output a pulse laser beam having the second polarization direction and transmitted at the second transmittance in an input pulse laser beam from outside, and part of the pulse laser beam returned from the transfer optical system,
the transfer optical system including
a ¼-wavelength mirror pair including a first ¼-wavelength mirror and a second ¼-wavelength mirror, the first ¼-wavelength mirror being configured to shift a phase of a pulse laser beam by ¼ of a wavelength of the pulse laser beam and reflect the pulse laser beam, the second ¼-wavelength mirror being configured to shift the phase of the pulse laser beam reflected by the first ¼-wavelength mirror by ¼ of the wavelength of the pulse laser beam and reflect the pulse laser beam, and
a reflection mirror pair disposed on an optical path before and after the ¼-wavelength mirror pair or on an optical path between the ¼-wavelength mirror pair,
the transfer optical system being configured to transfer an image of the input pulse laser beam on the polarization beam splitter to the optical path between the ¼-wavelength mirror pair at one-to-one magnification as a first transfer image and transfer the first transfer image to the polarization beam splitter at one-to-one magnification as a second transfer image.

2. The pulse width expansion apparatus according to claim 1, wherein
the reflection mirror pair include a first reflection mirror and a second reflection mirror,
the first reflection mirror reflects a pulse laser beam reflected by the first ¼-wavelength mirror toward the second reflection mirror, and
the second reflection mirror reflects the pulse laser beam reflected by the first reflection mirror toward the second ¼-wavelength mirror.

3. The pulse width expansion apparatus according to claim 2, wherein the transfer optical system transfers the first transfer image to an intermediate position between the first reflection mirror and the second reflection mirror.

4. The pulse width expansion apparatus according to claim 2, wherein the first ¼-wavelength mirror and the second ¼-wavelength mirror bend an optical path of a pulse laser beam at an angle of 45°.

5. The pulse width expansion apparatus according to claim 2, further comprising:
a first gonio stage on which the first ¼-wavelength mirror and the first reflection mirror are placed; and
a second gonio stage on which the second ¼-wavelength mirror and the second reflection mirror are placed, wherein
the first gonio stage has a rotational axis along an incidence-emission optical axis of the first ¼-wavelength mirror, and
the second gonio stage has a rotational axis along an incidence-emission optical axis of the second ¼-wavelength mirror.

6. The pulse width expansion apparatus according to claim 5, further comprising:
a first rotation stage on which the first gonio stage is placed; and
a second rotation stage on which the second gonio stage is placed, wherein
the first rotation stage has a rotational axis passing through an intersection point between the incidence-emission optical axis of the first ¼-wavelength mirror and an incidence-emission optical axis of the first reflection mirror, and
the second rotation stage has a rotational axis passing through an intersection point between the incidence-emission optical axis of the second ¼-wavelength mirror and an incidence-emission optical axis of the second reflection mirror.

7. The pulse width expansion apparatus according to claim 1, further comprising a gonio stage on which the ¼-wavelength mirror pair and the reflection mirror pair are placed, wherein
the gonio stage has a rotational axis along an incidence-emission optical axis of the ¼-wavelength mirror pair.

8. The pulse width expansion apparatus according to claim 7, further comprising an XYZ stage that is movable in three directions orthogonal to one another, wherein
the gonio stage is placed on the XYZ stage.

9. The pulse width expansion apparatus according to claim 1, wherein the polarization beam splitter is disposed at a tilt of 45° relative to the optical axis of the input pulse laser beam.

10. The pulse width expansion apparatus according to claim 9, wherein
the ¼-wavelength mirror pair convert the second polarization direction of the pulse laser beam reflected by the polarization beam splitter into the first polarization direction and output the pulse laser beam, and
the polarization beam splitter transmits the pulse laser beam having the first polarization direction and returned from the transfer optical system, at the first transmittance, so that the pulse laser beam is incident on the transfer optical system again.

11. The pulse width expansion apparatus according to claim 10, wherein
the ¼-wavelength mirror pair convert the first polarization direction of the pulse laser beam transmitted through the polarization beam splitter at the first transmittance and input to the transfer optical system again into the second polarization direction and output the pulse laser beam, and
the polarization beam splitter reflects the pulse laser beam having the second polarization direction and returned from the transfer optical system at the first reflectance and outputs the pulse laser beam.

12. The pulse width expansion apparatus according to claim 11, wherein, in the transfer optical system, an optical path through which the image of the input pulse laser beam on the polarization beam splitter is transferred as the first transfer image and an optical path through which the first transfer image is transferred to the polarization beam splitter as the second transfer image are disposed in a line symmetric manner with respect to an optical path of an output pulse laser beam that is output from the polarization beam splitter.

13. The pulse width expansion apparatus according to claim 1, wherein the concave mirrors have a same focal length.

14. The pulse width expansion apparatus according to claim 1, wherein the pulse laser beam is an ArF laser beam.

15. An electronic device manufacturing method comprising:
   generating a pulse laser beam subjected to pulse width expansion through a laser system including a laser apparatus and a pulse width expansion apparatus;
   emitting the pulse laser beam to an exposure apparatus; and
   exposing a photosensitive substrate to the pulse laser beam in the exposure apparatus to manufacture an electronic device,
   the laser apparatus being configured to generate a linearly polarized pulse laser beam,
   the pulse width expansion apparatus including
      a polarization beam splitter configured to transmit a pulse laser beam having a first polarization direction in a linearly polarized pulse laser beam at a first transmittance, and reflect a pulse laser beam having a second polarization direction orthogonal to the first polarization direction at a first reflectance while transmitting the pulse laser beam having the second polarization direction at a second transmittance, and
      a transfer optical system in which the pulse laser beam reflected by the polarization beam splitter is reflected by a plurality of concave mirrors and returned to the polarization beam splitter,
   the polarization beam splitter being configured to synthesize and output a pulse laser beam having the second polarization direction and transmitted at the second transmittance in an input pulse laser beam from outside, and part of the pulse laser beam returned from the transfer optical system,
   the transfer optical system including
      a ¼-wavelength mirror pair including a first ¼-wavelength mirror and a second ¼-wavelength mirror, the first ¼-wavelength mirror being configured to shift a phase of a pulse laser beam by ¼ of a wavelength of the pulse laser beam and reflect the pulse laser beam, the second ¼-wavelength mirror being configured to shift the phase of the pulse laser beam reflected by the first ¼-wavelength mirror by ¼ of the wavelength of the pulse laser beam and reflect the pulse laser beam, and
      a reflection mirror pair disposed on an optical path before and after the ¼-wavelength mirror pair or on an optical path between the ¼-wavelength mirror pair,
   the transfer optical system being configured to transfer an image of the input pulse laser beam on the polarization beam splitter to the optical path between the ¼-wavelength mirror pair at one-to-one magnification as a first transfer image and transfer the first transfer image to the polarization beam splitter at one-to-one magnification as a second transfer image.

16. A pulse width expansion apparatus comprising:
   a polarization beam splitter configured to transmit a pulse laser beam having a first polarization direction in a linearly polarized pulse laser beam at a first transmittance, and reflect a pulse laser beam having a second polarization direction orthogonal to the first polarization direction at a first reflectance while transmitting the pulse laser beam having the second polarization direction at a second transmittance; and
   a transfer optical system in which the pulse laser beam reflected by the polarization beam splitter is reflected by a plurality of concave mirrors and returned to the polarization beam splitter,
   the polarization beam splitter being configured to synthesize and output a pulse laser beam having the second polarization direction and transmitted at the second transmittance in an input pulse laser beam from outside, and part of the pulse laser beam returned from the transfer optical system,
   the transfer optical system including
      a first transfer optical system including a first ¼-wavelength mirror and a first reflection mirror, the first ¼-wavelength mirror being configured to shift a phase of a pulse laser beam by ¼ of a wavelength of the pulse laser beam and reflect the pulse laser beam, the first reflection mirror being configured to reflect the pulse laser beam reflected by the first ¼-wavelength mirror toward the first ¼-wavelength mirror, and
      a second transfer optical system including a second ¼-wavelength mirror and a second reflection mirror, the second ¼-wavelength mirror being configured to shift the phase of the pulse laser beam by ¼ of the wavelength of the pulse laser beam and reflect the pulse laser beam, the second reflection mirror being configured to reflect the pulse laser beam reflected by the second ¼-wavelength mirror toward the second ¼-wavelength mirror,
   the first transfer optical system being configured to transfer an image of the input pulse laser beam on the polarization beam splitter to the first reflection mirror at one-to-one magnification as a first transfer image and transfer the first transfer image to the polarization beam splitter at one-to-one magnification as a second transfer image,
   the second transfer optical system being configured to transfer the second transfer image to the second reflection mirror at one-to-one magnification as a third transfer image and transfer the third transfer image to the polarization beam splitter at one-to-one magnification as a fourth transfer image.

17. The pulse width expansion apparatus according to claim 16, wherein
   at least one of the first transfer optical system and the second transfer optical system includes a 45° right angle prism element, and
   the 45° right angle prism element includes
      a ¼-wavelength mirror film on a side surface including a hypotenuse of the 45° right angle prism element, the ¼-wavelength mirror film serving as a ¼-wavelength mirror, and
      a reflective film on a side surface including one of adjacent sides at a right angle of the 45° right angle prism element, the reflective film serving as a reflection mirror.

18. The pulse width expansion apparatus according to claim 17, wherein the 45° right angle prism element further includes a reflection suppression film on a side surface including the other of the adjacent sides at the right angle of the 45° right angle prism element.

19. The pulse width expansion apparatus according to claim 18, wherein the 45° right angle prism element is rotatably fixed as having a rotational axis along an incidence-emission optical axis of the ¼-wavelength mirror film.

20. The pulse width expansion apparatus according to claim 16, wherein, in the transfer optical system, an optical path through which the image of the input pulse laser beam on the polarization beam splitter is transferred as the first transfer image and an optical path through which the second transfer image is transferred as the third transfer image are disposed in a line symmetric manner with respect to an optical path of an output pulse laser beam that is output from the polarization beam splitter.

* * * * *